United States Patent
Ahn et al.

(10) Patent No.: US 10,950,602 B2
(45) Date of Patent: Mar. 16, 2021

(54) SEMICONDUCTOR DEVICES

(71) Applicant: Samsung Electronics Co., Ltd., Suwon-si (KR)

(72) Inventors: Gyu-Hwan Ahn, Gunpo-si (KR); Sung-Soo Kim, Hwaseong-si (KR); Chae-Ho Na, Changwon-si (KR); Dong-Hyun Roh, Suwon-si (KR); Sang-Jin Hyun, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/401,362

(22) Filed: May 2, 2019

(65) Prior Publication Data
US 2020/0098751 A1 Mar. 26, 2020

(30) Foreign Application Priority Data

Sep. 20, 2018 (KR) .......................... 10-2018-0112646
Apr. 19, 2019 (KR) .......................... 10-2019-0046365

(51) Int. Cl.
| | |
|---|---|
| H01L 29/76 | (2006.01) |
| H01L 27/088 | (2006.01) |
| H01L 21/8234 | (2006.01) |
| H01L 21/762 | (2006.01) |

(52) U.S. Cl.
CPC .... *H01L 27/0886* (2013.01); *H01L 21/76224* (2013.01); *H01L 21/823481* (2013.01)

(58) Field of Classification Search
None
See application file for complete search history.

(56) References Cited

U.S. PATENT DOCUMENTS

| | | | |
|---|---|---|---|
| 7,932,148 B2 | 4/2011 | Chang et al. | |
| 7,977,205 B2 | 7/2011 | Dong et al. | |
| 8,431,485 B2 | 4/2013 | Jung et al. | |
| 9,508,545 B2 | 11/2016 | Chen et al. | |
| 9,799,527 B2 | 10/2017 | Yamada et al. | |
| 10,211,103 B1 * | 2/2019 | Huang | H01L 21/28247 |
| 2006/0263991 A1 * | 11/2006 | Lee | H01L 21/76232 |
| | | | 438/296 |
| 2007/0200169 A1 | 8/2007 | Kim | |

FOREIGN PATENT DOCUMENTS

KR        10-1200509        11/2012

* cited by examiner

*Primary Examiner* — Hung K Vu
(74) *Attorney, Agent, or Firm* — Myers Bigel, P.A.

(57) ABSTRACT

A semiconductor device includes active fins on a substrate, a first isolation pattern on the substrate, the first isolation pattern extending on a lower sidewall of each of the active fins, a third isolation pattern including an upper portion extending into the first isolation pattern and a lower portion extending into an upper portion of the substrate, the lower portion contacting the upper portion of the third isolation pattern, and having a lower surface with a width greater than that of an upper surface thereof, and a second isolation pattern extending in the substrate under the third isolation pattern, contacting the third isolation pattern, and having a rounded lower surface.

20 Claims, 26 Drawing Sheets

SEMICONDUCTOR DEVICES

CROSS-REFERENCE TO RELATED APPLICATIONS

This application claims priority under 35 USC § 119 to Korean Patent Application No. 10-2018-0112646, filed on Sep. 20, 2018, and Korean Patent Application No. 10-2019-0046365, filed on Apr. 19, 2019, in the Korean Intellectual Property Office (KIPO), the contents of which are herein incorporated by reference in their entirety.

BACKGROUND

FinFETs may be formed to improve integration of semiconductor devices. In a process for forming finFETs, active fins may be formed on a substrate, the active fins may be partially removed to form a trench, and an isolation pattern may be formed to fill the trench. However, if the isolation pattern fails to completely fill the trench, a void may occur in or under the isolation pattern, so that the insulation properties of the isolation pattern may be deteriorated.

SUMMARY

Example embodiments provide semiconductor devices having improved characteristics.

According to example embodiments, there is provided a semiconductor device. The semiconductor device may include active fins on a substrate, a first isolation pattern on the substrate, the first isolation pattern covering a lower sidewall of each of the active fins, a third isolation pattern including an upper portion extending through the first isolation pattern and a lower portion extending through an upper portion of the substrate, contacting the upper portion of the third isolation pattern, and having a lower surface of which a width is greater than that of an upper surface thereof, and a second isolation pattern extending through an upper portion of the substrate under the third isolation pattern, contacting the third isolation pattern, and having a rounded lower surface.

According to example embodiments, there is provided a semiconductor device. The semiconductor device may include active fins on a substrate, a first isolation pattern on the substrate, the first isolation pattern covering a lower sidewall of each of the active fins, a third isolation pattern extending through the first isolation pattern, and a second isolation pattern having a cross-section of a circular shape or an elliptical shape, the second isolation pattern including an upper portion extending through a portion of the first isolation pattern under the third isolation pattern, the upper portion contacting the third isolation pattern and a lower portion extending through an upper portion of the substrate, the lower portion contacting the upper portion of the second isolation pattern.

According to example embodiments, there is provided a semiconductor device. The semiconductor device may include active fins on a substrate, a first isolation pattern on the substrate, the first isolation pattern covering a lower sidewall of each of the active fins, a third isolation pattern including an upper portion extending through the first isolation pattern and a lower portion extending through an upper portion of the substrate, the lower portion having a lower surface of which a width is greater than that of an upper surface thereof, a second isolation pattern extending through an upper portion of the substrate under the third isolation pattern, contacting the third isolation pattern, and having a rounded lower surface, a gate structure on the active fins, and a source/drain layer on the substrate adjacent to the gate structure.

Semiconductor devices in accordance with example embodiments may include an isolation structure without or free of one or more voids therein. Accordingly, the insulation properties of the isolation structure may be improved, and semiconductor devices including the isolation structure may have improved electrical characteristics.

DESCRIPTION OF EMBODIMENTS

Semiconductor devices in accordance with example embodiments will be described more fully hereinafter with reference to the accompanying drawings.

Hereinafter, two directions intersecting with each other among horizontal directions substantially parallel to an upper surface of a substrate are defined as first and second directions, respectively. In example embodiments, the first and second directions may be substantially orthogonal to each other.

Figure 1:
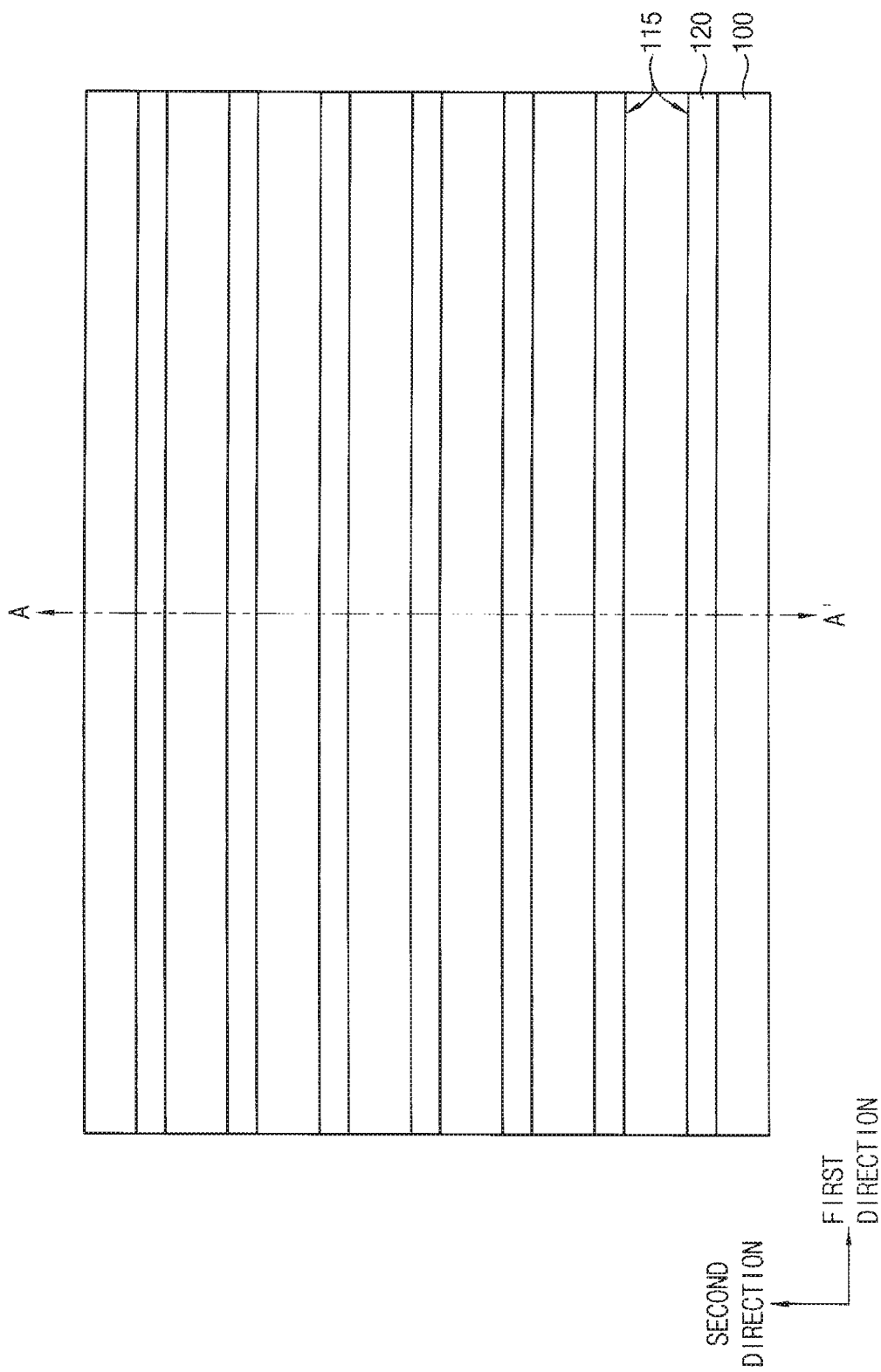
FIGS. 1 to 13 are plan views and cross-sectional views illustrating methods of forming an isolation structure in accordance with example embodiments.
Figure 2:
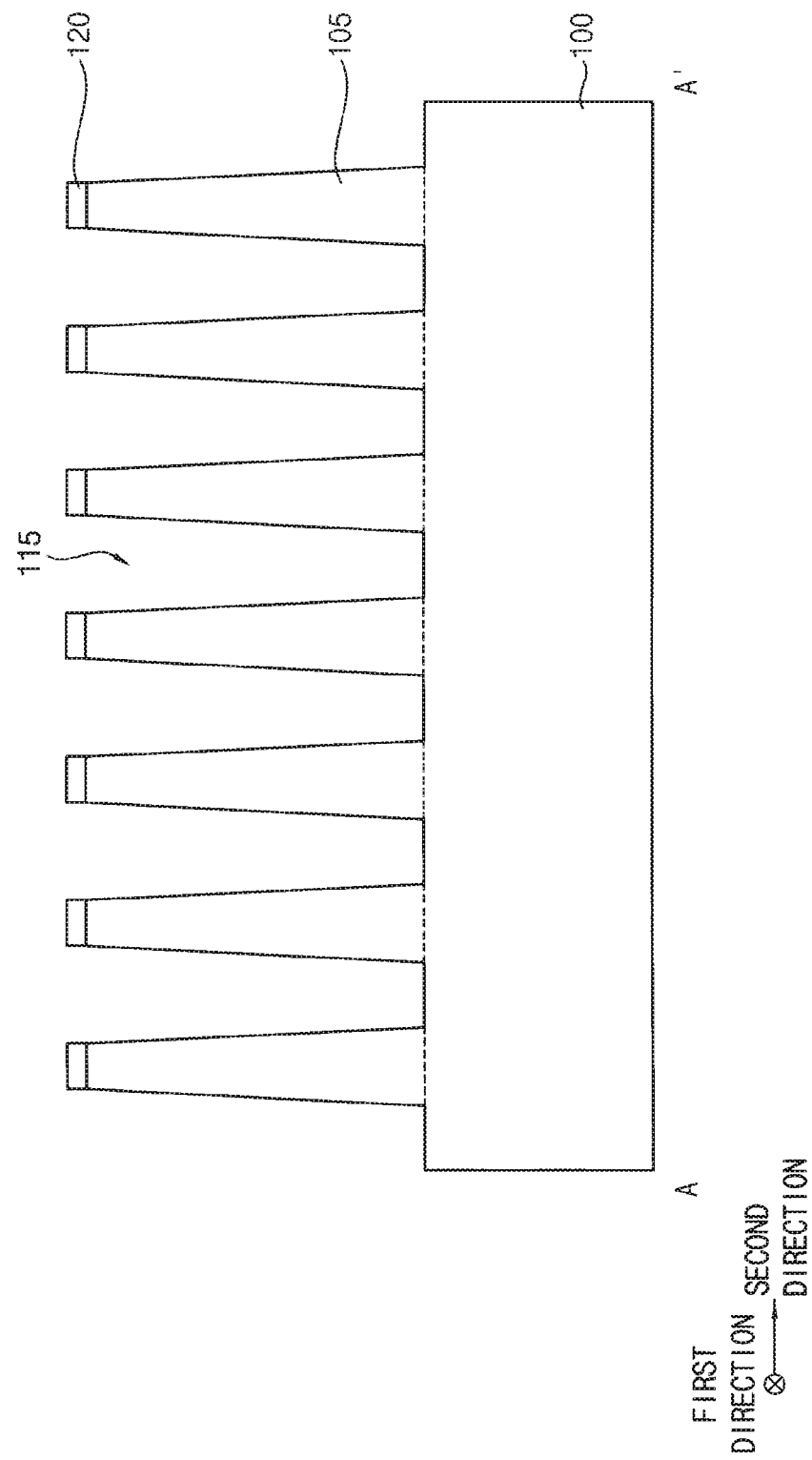
Figure 3:
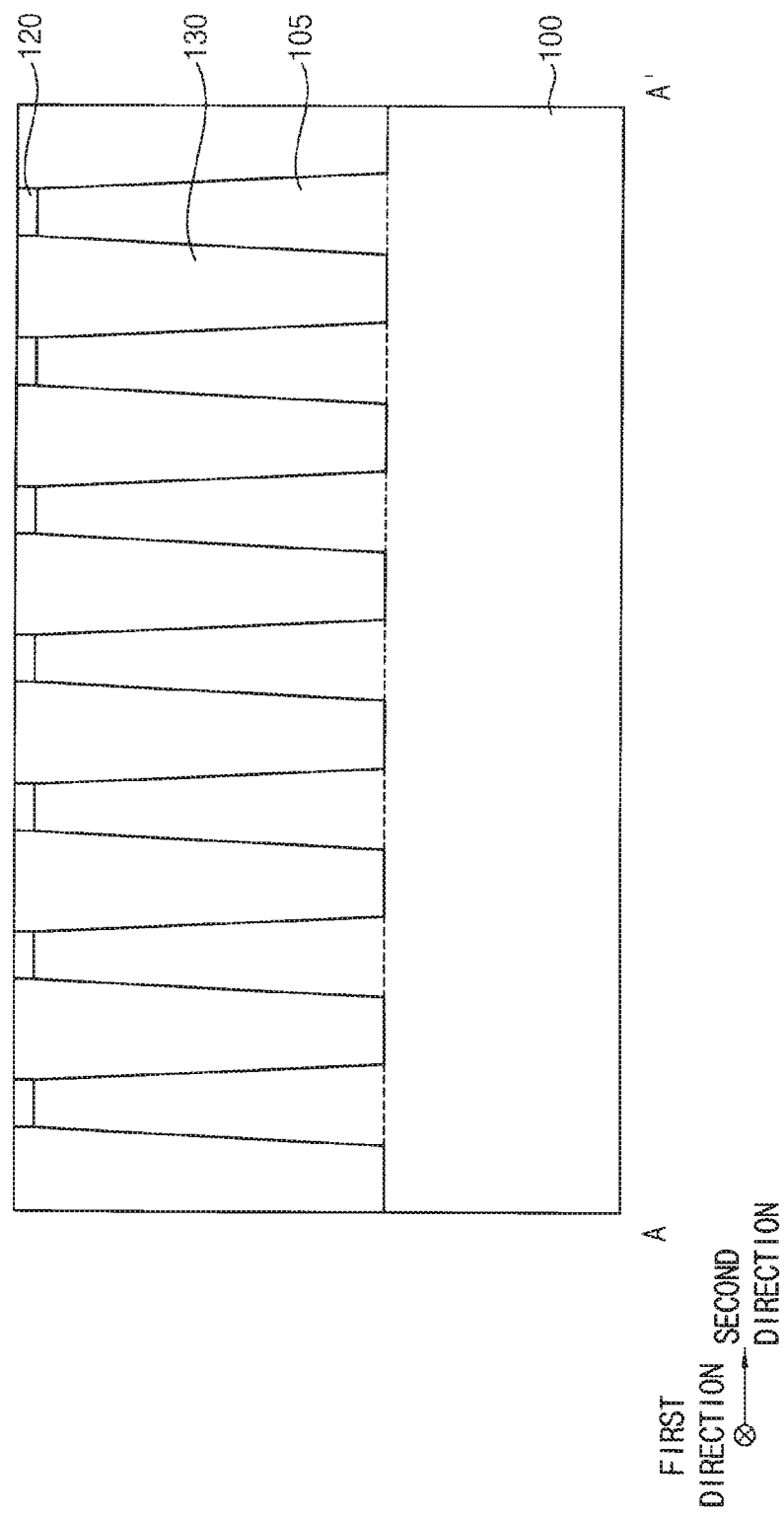
Figure 4:
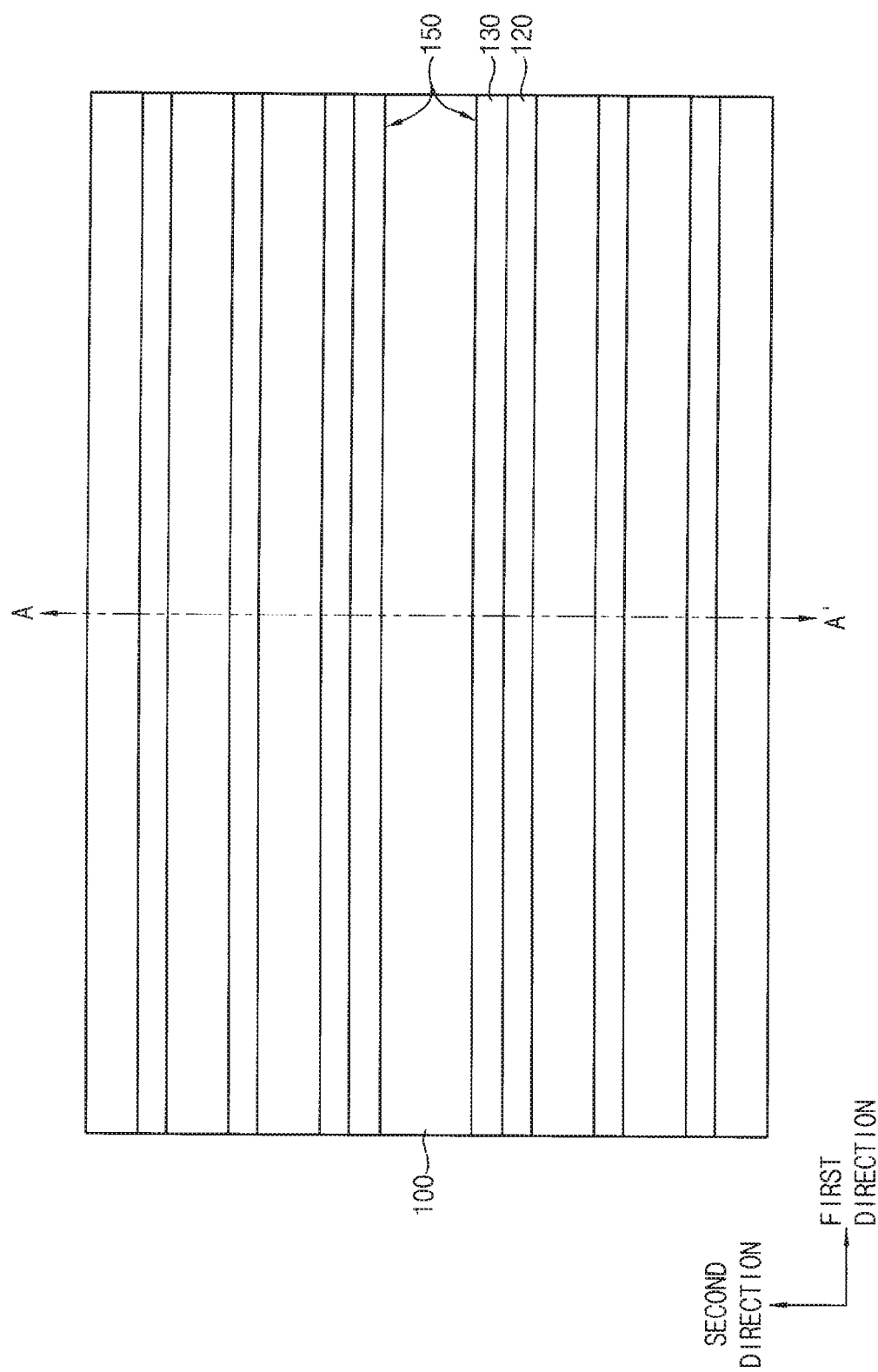

FIGS. 1 to 9 are plan views and cross-sectional views illustrating a method of forming an isolation structure in accordance with example embodiments. Specifically, FIGS. 1 and 4 are plan views, and FIGS. 2 to 3, and 5 to 9 are cross-sectional views taken along lines A-A' of corresponding plan views, respectively.

Referring to FIGS. 1 and 2, an active fin 105 may be formed on a substrate 100.

In example embodiments, the substrate 100 may include semiconductor materials, e.g., silicon, germanium, silicon-germanium, etc., or III-V compounds e.g., GaP, GaAs, GaSb, etc. In some embodiments, the substrate 100 may be a silicon-on-insulator (SOI) substrate or a germanium-on-insulator (GOI) substrate.

The active fin 105 may be formed by forming a first etching mask 120 on the substrate 100, and performing a first etching process using the first etching mask 120 to remove an upper portion of the substrate 100. In example embodiments, the active fin 105 may extend in the first direction, and a plurality of active fins 105 may be formed to be spaced apart from each other along the second direction. A space formed along the second direction between the active fins 105 on the substrate 100 may be referred to as a first recess 115.

The first etching mask 120 may include a nitride, e.g., silicon nitride. The terms first, second, third, etc. are used herein merely to distinguish or differentiate one element from another.

Referring to FIG. 3, a first isolation pattern 130 may be formed on the substrate 100 to fill the first recess 115. It will be understood that a pattern or element that "fills" (or "covers") another element may partially or completely fill (or may partially or completely cover) the other element.

Similarly, a pattern or element that extends "through" another element may extend partially or completely through the other element.

The first isolation pattern 130 may be formed by forming a first isolation layer on the substrate 100 to extend on or cover the active fin 105 and the first etching mask 120, and planarizing the first isolation layer until an upper surface of the first etching mask 120 may be exposed. In example embodiments, the planarization process may be performed by, e.g., a chemical mechanical polishing process (CMP) process and/or an etch back process.

The first isolation pattern 130 may include an electrically insulating material, such as an oxide, e.g., silicon oxide.

Figure 5:
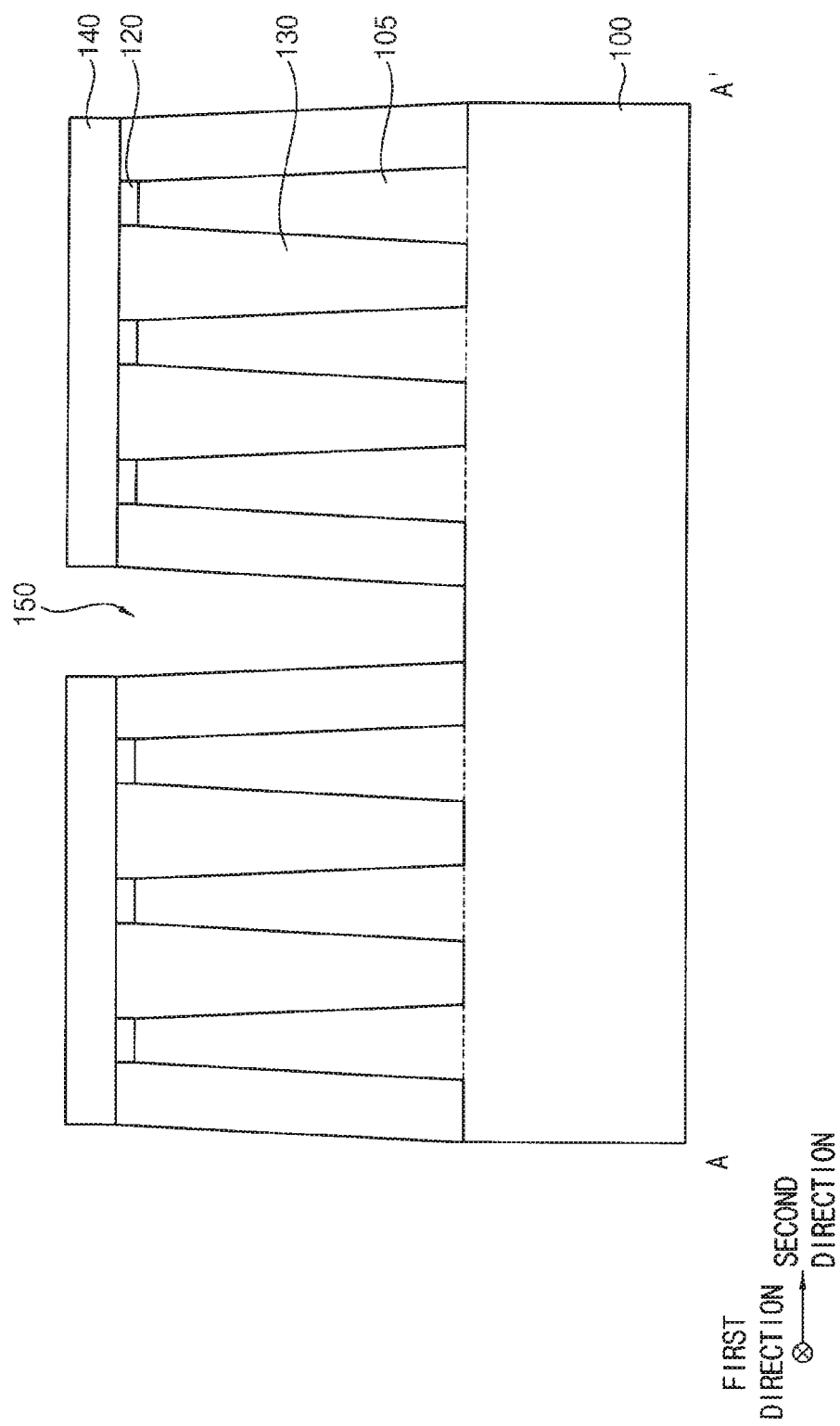

Referring to FIGS. 4 and 5, after forming a second etching mask 140 on the upper surface of the first etching mask 120 and an upper surface of the first isolation pattern 130, one or ones of the active fins 105, the first etching mask 120 on an upper surface thereof and a portion of the first isolation pattern 130 adjacent thereto in the second direction may be etched by performing a second etching process using the second etching mask 140, and thus a first opening 150 may be formed to expose a portion of the upper surface of the substrate 100.

Depending on the characteristics of the second etching process, a sidewall of the first opening 150 may have a slope inclined (e.g., at a non-orthogonal angle) with respect to the upper surface of the substrate 100. Alternatively, the sidewall of the first opening 150 may have a slope substantially vertical or orthogonal to the upper surface of the substrate 100.

FIG. 5 illustrates that three active fins 105 are disposed at each of opposite sides of one first opening 150 in the second direction, however, the inventive concepts may not be limited thereto. That is, fewer or more (and not necessarily equal numbers of) active fins 105 may be disposed on opposite sides of the first opening 150.

Figure 6:
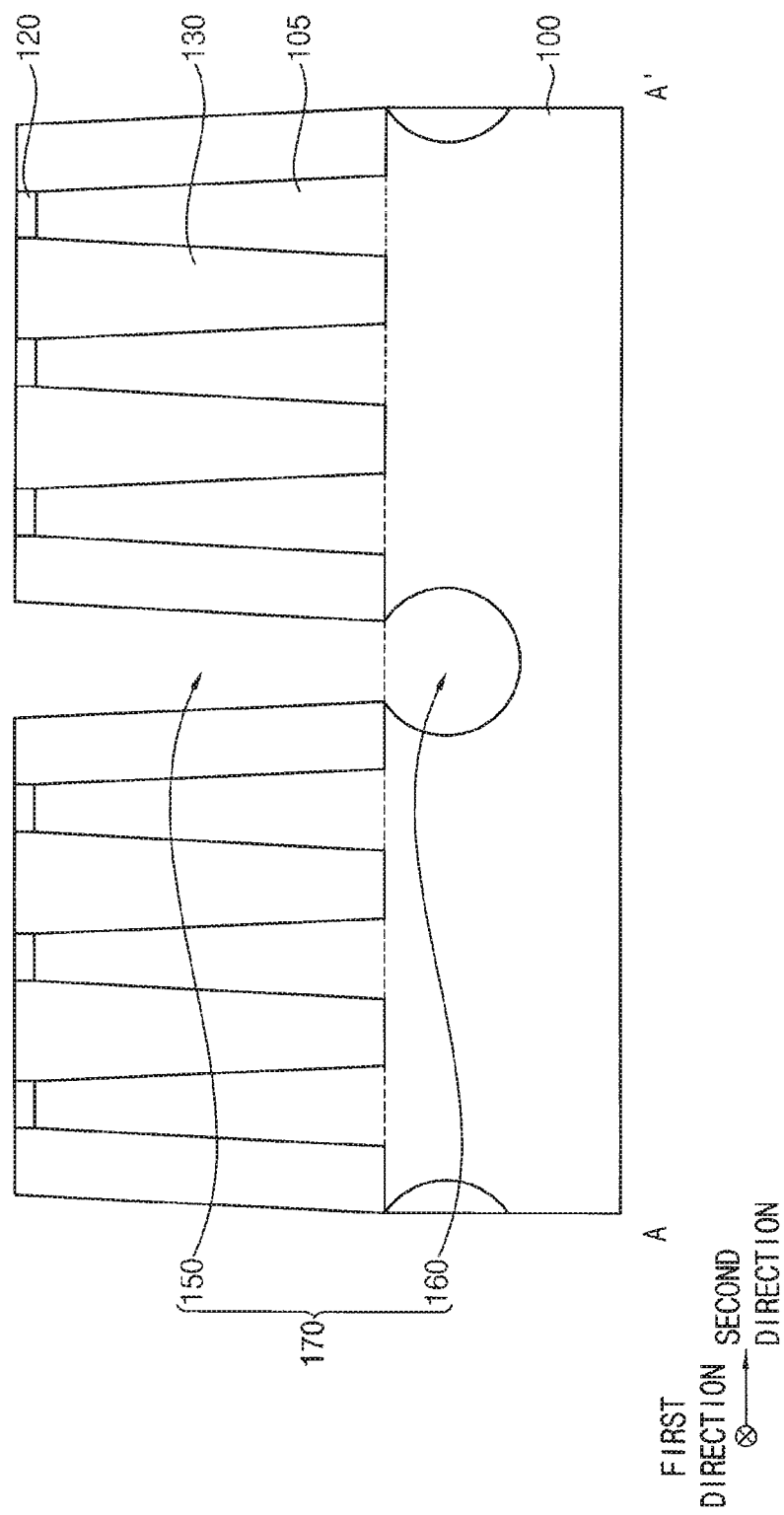

Referring to FIG. 6, the exposed portion of the substrate 100 may be removed by performing a third etching process using the second etching mask 140, and thus a trench 160 connected to the first opening 150 may be formed at an upper portion of the substrate 100. Hereinafter, the first opening 150 and the trench 160 connected thereto altogether may be referred to as or collectively define a trench structure 170.

In example embodiments, the second and third etching processes may be performed by a dry etching process. However, the third etching process may be performed with a lower voltage than the second etching process, so that may have an isotropic etching characteristic. That is, the trench 160 formed by the third etching process may have a circular shape or an elliptical shape.

In example embodiments, a sidewall of the trench 160 may have a varying slope with respect to the upper surface of the substrate 100, and thus a width of the trench in the second direction may vary according to the height thereof. In one embodiment, the width of the trench 160 may increase from an upper portion to a central portion, and may decrease from the central portion to a lower portion. Accordingly, the width of the central portion of the trench 160 in the second direction may be greater than that of a lower surface of the first opening 150, e.g., a portion of the first opening 150 adjacent the substrate.

The second etching mask 140 may be removed during the third etching process, or if a portion thereof remains, the second etching mask 140 may be removed by performing an additional process, e.g., an ashing process and/or stripping process.

Figure 7:
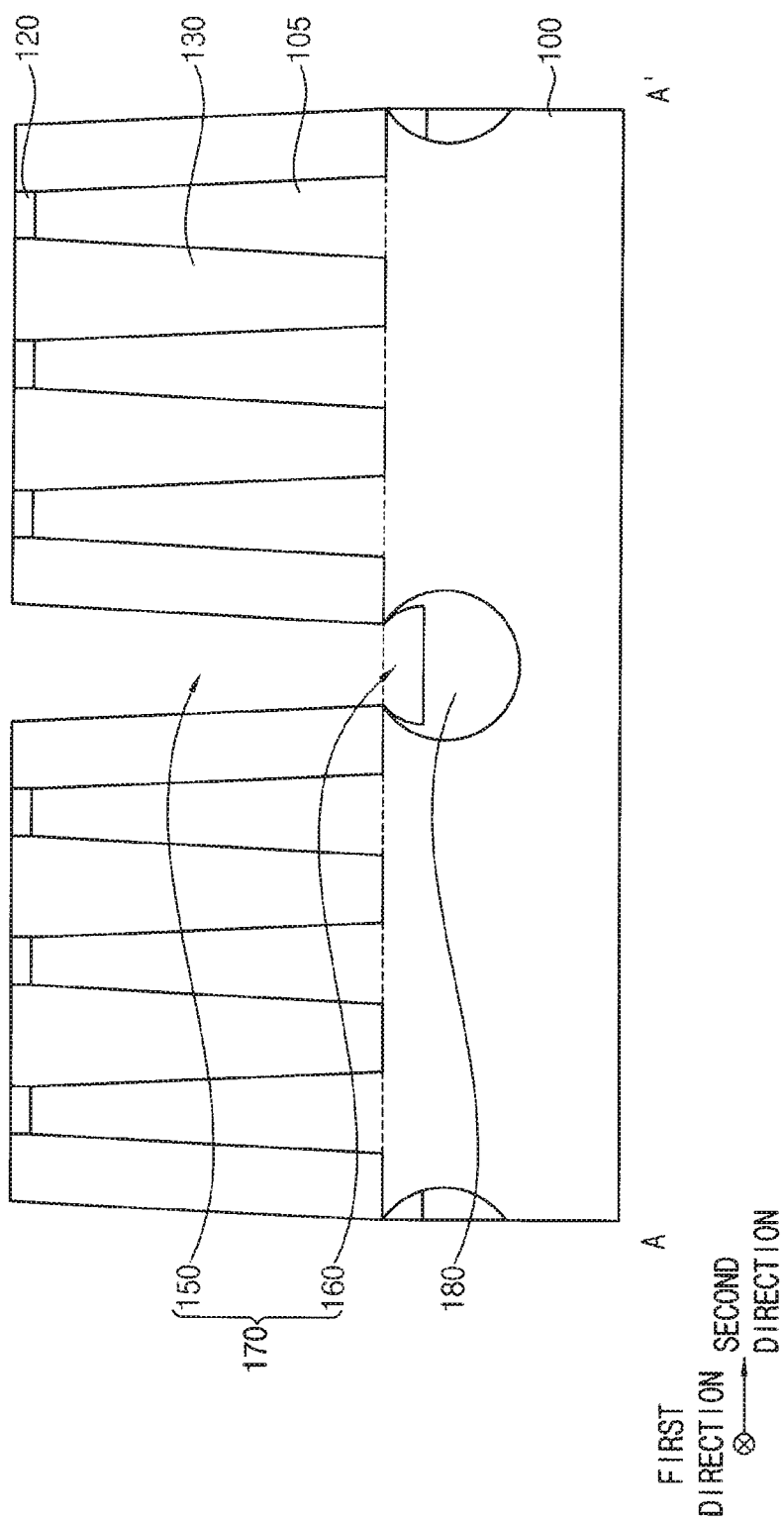
Figure 8:
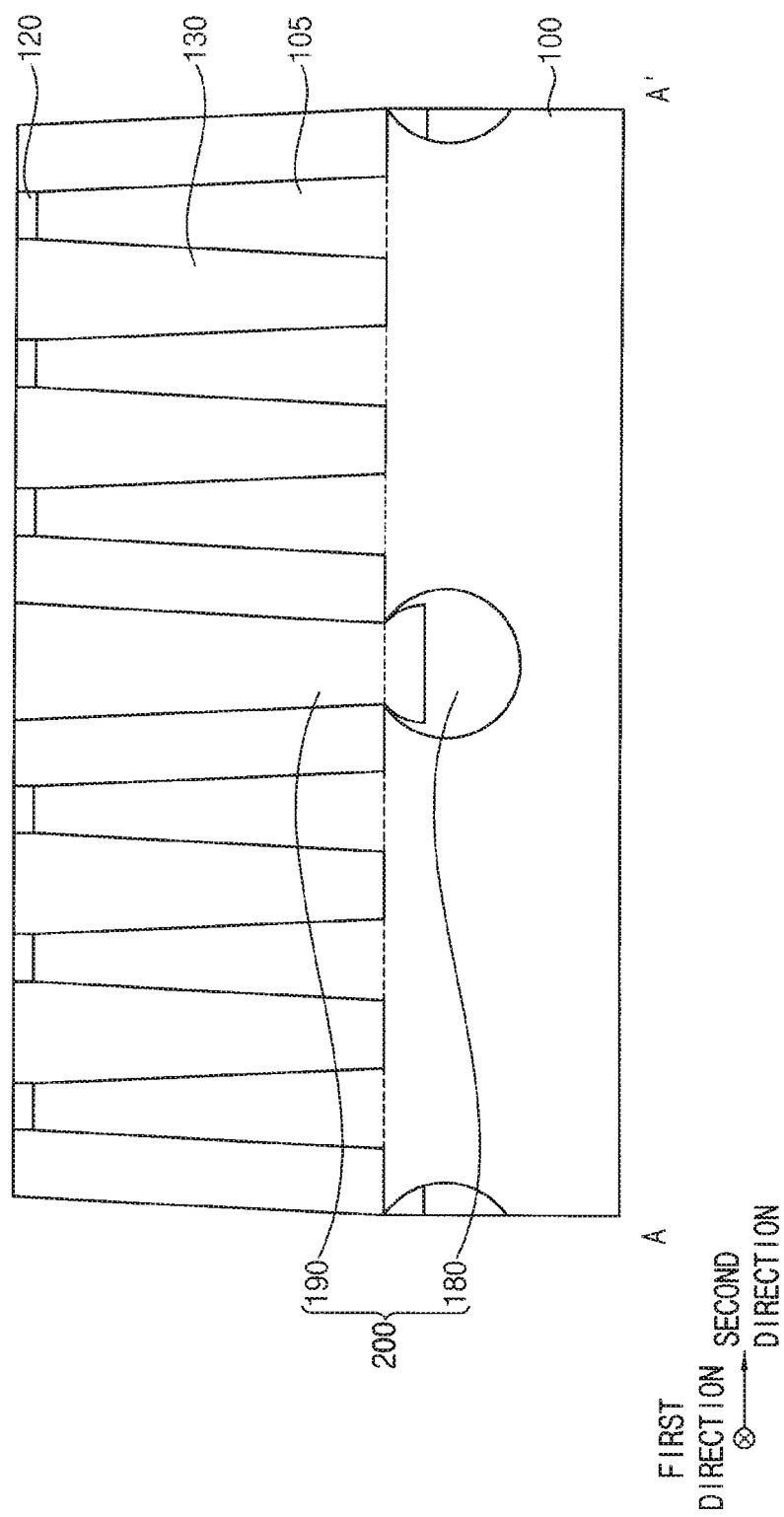

Referring to FIGS. 7 and 8, a second isolation pattern 180 may be formed to fill a portion of the trench 160, and a third isolation pattern 190 may be formed to fill a remaining portion of the trench 160.

In example embodiments, by performing a selective deposition process, the second isolation pattern 180 may be formed neither on the first etching mask 120 nor on the first isolation pattern 130, which may include a nitride and an oxide, respectively, but may be formed only on the portion of the substrate 100, which may include silicon, exposed by the trench 160. That is, the first isolation pattern 130 may be free of contact with the second isolation pattern 180 due to the selective deposition process. For example, the sidewalls of the first isolation pattern 130 may be free of the second isolation pattern 180 thereon. In one embodiment, the second isolation pattern 180 may be formed to fill a central portion and a lower portion of the trench 160, and may also be formed on a portion of the substrate 100 exposed by the trench 160, that is, an exposed sidewall of the trench 160, which is disposed on the upper portion of the substrate 100.

A portion of the second isolation pattern 180 on the exposed sidewall of the trench 160 may have a thickness increasing from a top to a bottom, and an outer sidewall of the portion of the second isolation pattern 180 may have a fluctuating slope not vertical to the upper surface of the substrate 100. However, the inventive concepts may not be limited thereto, the portion of the second isolation pattern 180 on the exposed sidewall of the trench 160 may be formed of a thin film shape having a constant thickness from the top to the bottom, and the outer sidewall of the portion of the second isolation pattern 180 may have a vertical slope to the upper surface of the substrate 100 not fluctuating.

The second isolation pattern 180 may include an electrically insulating material, such as a nitride, e.g., silicon nitride, or an oxide, e.g., silicon oxide.

The third isolation pattern 190 may be formed on the second isolation pattern 180 to fill a remaining portion of the trench structure 170.

The third isolation pattern 190 may be formed by performing a process, e.g., a chemical vapor deposition (CVD) process, an atomic layer deposition (ALD) process, etc., to form a third isolation layer on the second isolation pattern 180, the first isolation pattern 130 and the first etching mask 120, and planarizing the third isolation layer until the upper surfaces of the first isolation pattern 130 and the first etching mask 120 may be exposed.

The third isolation pattern 190 may include an electrically insulating material, such as an oxide, e.g., silicon oxide. Accordingly, when the second isolation pattern 180 includes an oxide, the second and third isolation patterns 180 and 190 may be merged with each other. In some embodiments, the second and third isolation patterns 180 and 190 altogether may be merged with the first isolation pattern 130. In other embodiments, the first, second, and/or third isolation patterns 130, 180, and/or 190 may include different electrically insulating materials.

The second and third isolation patterns 180 and 190 sequentially stacked and contacting each other in the trench structure 170 altogether may form or may collectively define an isolation structure 200. In example embodiments, the isolation structure 200 may extend in the first direction, and a plurality of isolation structures 200 may be formed to be spaced apart from each other along the second direction.

FIGS. 9 to 12 are cross-sectional views illustrating shapes of isolation patterns in accordance with example embodiments.

The isolation patterns are substantially the same as or similar to the isolation patterns in FIGS. 7 and 8, except for the shapes. Accordingly, like reference numerals refer to like elements, and detailed descriptions thereon are omitted herein for brevity.

Figure 9:
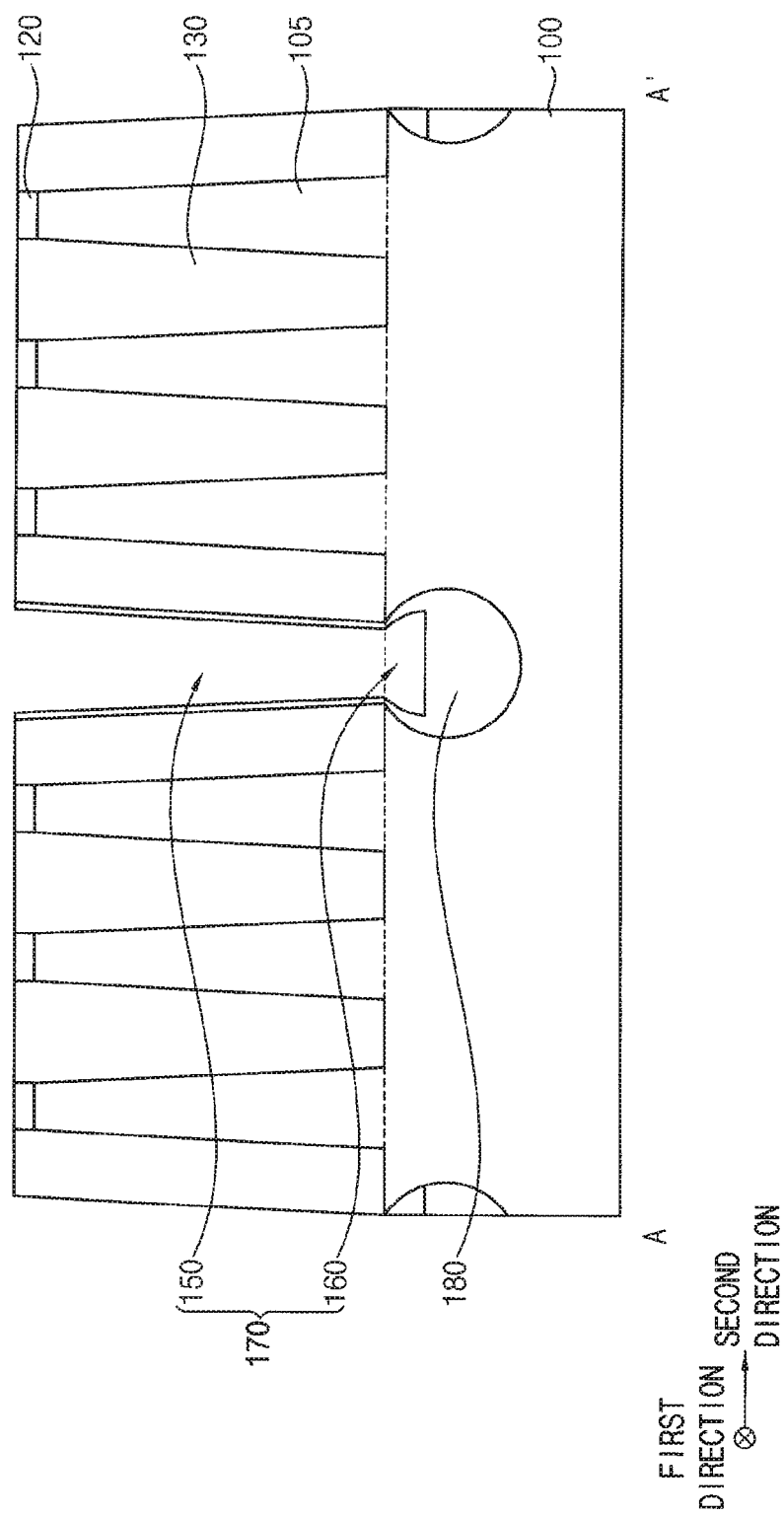
Figure 10:
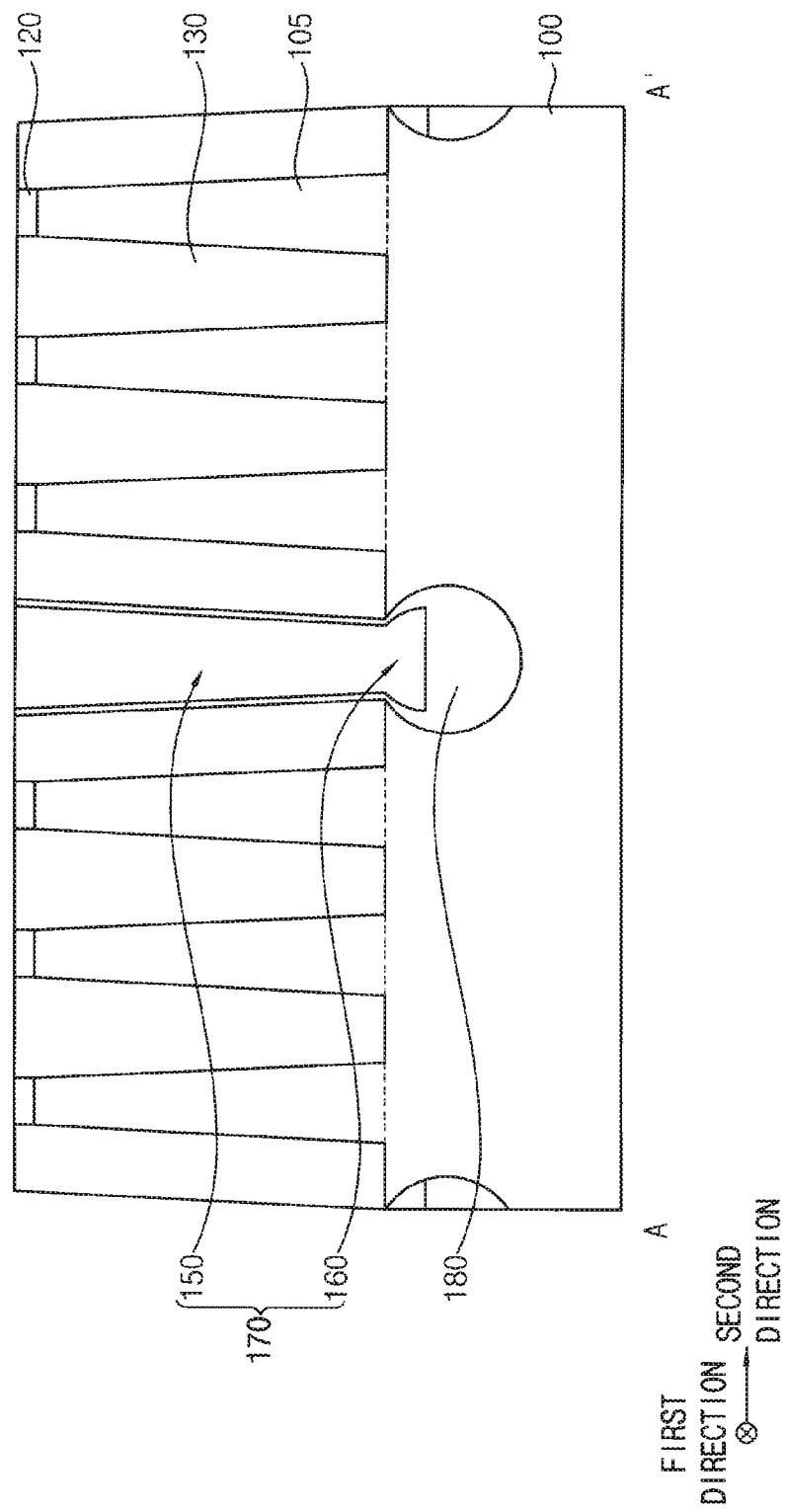

Referring to FIGS. 9 and 10, when the second isolation pattern 180 is formed by performing the selective deposition process, the second isolation pattern 180 may be formed not only on the portion of the substrate 100 exposed by the trench 160, but also on an exposed sidewall of the first isolation pattern 130. That is, the second isolation pattern may be formed of a thin film shape to cover a sidewall of the first opening 150, may be formed to fill the central portion and the lower portion of the trench 160, and may also be formed on the exposed sidewall of the trench 160. In this case, the second isolation pattern 180 may be formed to cover all the sidewalls of the first opening 150 and the trench 160.

In one embodiment, a portion of the second isolation pattern 180 on the sidewall of the first opening 150 may have a constant slope not vertical to the upper surface of the substrate 100, and the portion of the second isolation pattern 180 on the exposed sidewall of the trench 160 may have a fluctuating slope not vertical to the upper surface of the substrate 100.

The third isolation pattern 190 may be formed on the second isolation pattern to fill a remaining portion of the trench structure 170.

Figure 11:
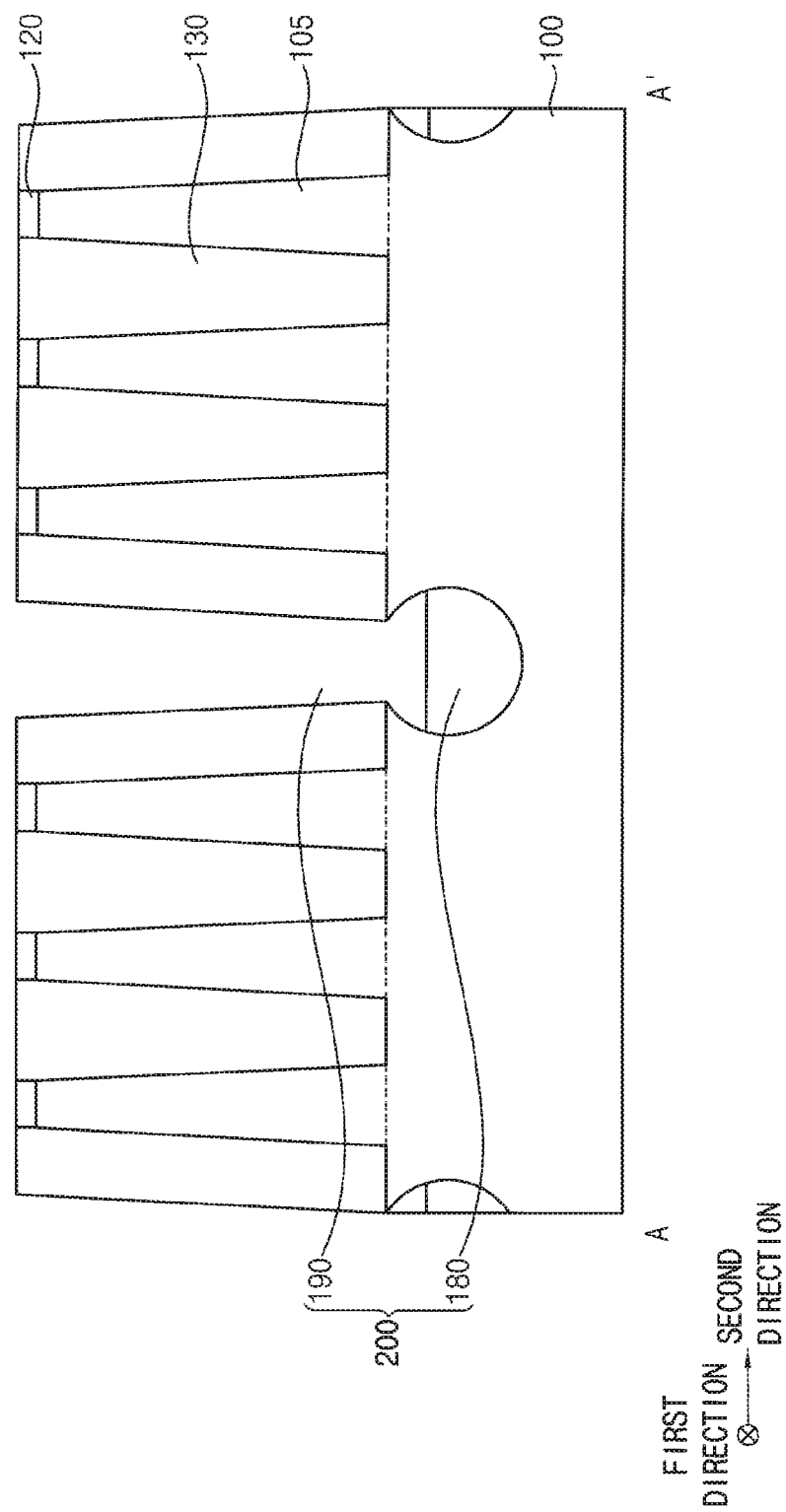
Figure 12:
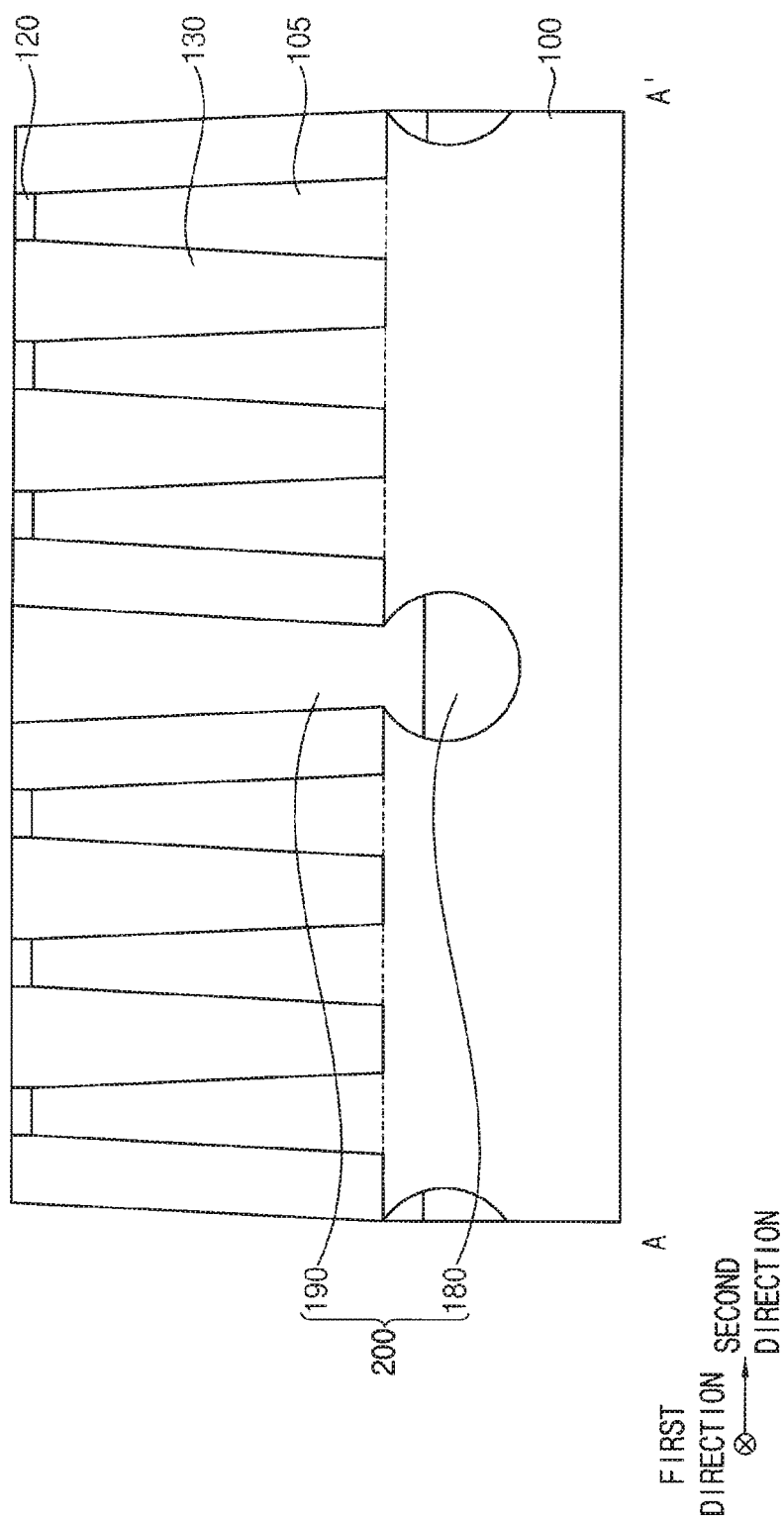

Referring to FIGS. 11 and 12, when the second isolation pattern 180 is formed by performing the selective deposition process, the second isolation pattern 180 may be formed to fill the central portion and the lower portion of the trench 160, but may not be formed on the exposed sidewall of the trench 160.

In this case, the second isolation pattern 180 may not cover the sidewall of the first opening 150 and the exposed sidewall of the trench 160, so that the third isolation pattern 190 formed to fill the remaining portion of the trench structure 170 may each contact the sidewall of the first opening 150 and the exposed sidewall of the trench 160.

Hereinafter, as described with reference to FIGS. 7 and 8, only the case with reference to FIGS. 7 and 8 that the second isolation pattern 180 is formed only on the sidewall of the trench 160 and fills the central portion and the lower portion of the trench 160 will be described for convenience of explanation.

Figure 13:
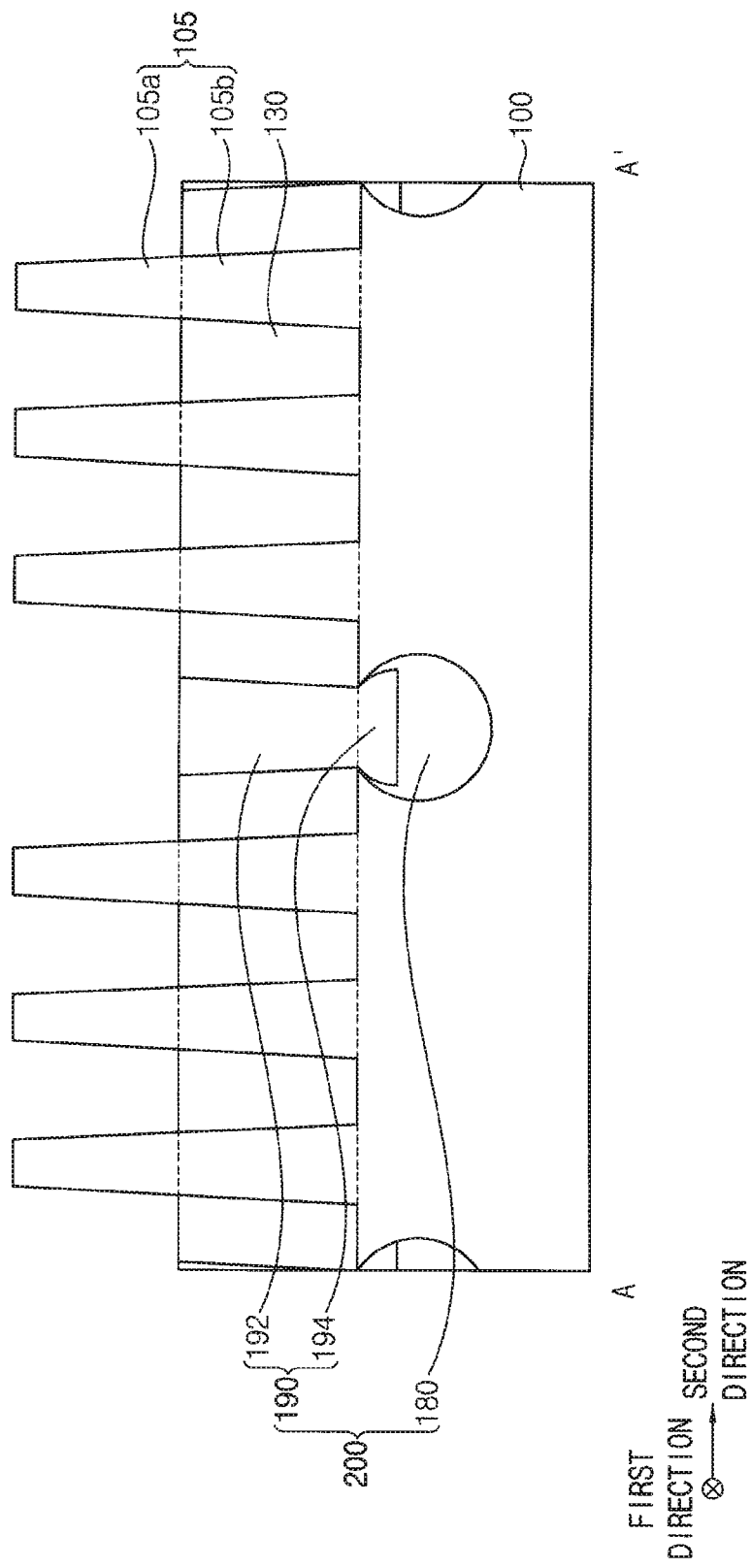

Referring to FIG. 13, upper portions of the first and third isolation patterns 130 and 190 may be removed to expose an upper portion of the active fin 105.

In example embodiments, the upper portions of the first and third isolation patterns 130 and 190 may be removed by a CMP process and/or an etch back process, and the first etching mask 120 on the active fin 105 may be also removed.

The active fin 105 may include a lower active pattern 105b of which a sidewall may be covered by the first isolation pattern 130, and an upper active pattern 105a on the lower active pattern 105b, which may be exposed.

As described above, after performing the selective deposition process to form the second. isolation pattern 180 partially filling the trench 160 on the substrate 100 that is exposed by the trench 160, an additional deposition process may be further performed to form the third isolation pattern 190 on the first isolation pattern 130 to fill the remaining portion of the trench structure 170, so that the isolation structure 200 may be formed to fill the trench structure 170.

Accordingly, in comparison with an isolation structure 200 formed to fill the trench structure 170 by one deposition process, each of the second and third isolation patterns 180 and 190 may be formed to have a small aspect ratio, and thus a void caused by not completely filling a lower portion of the trench structure 170, that is, the trench 160 may not occur. Accordingly, the insulation properties of the isolation structure 200 may be improved, and in semiconductor devices including the isolation structure 200, deterioration of electrical characteristics due to a leakage current may be reduced or prevented.

The isolation stricture 200 formed by the processes described above may have the following structural characteristics.

That is, the isolation structure 200 may include the second and third isolation patterns 180 and 190 sequentially stacked and contacting each other. In example embodiments, the isolation structure 200 may extend in the first direction.

The third isolation pattern 190 at an upper portion of the isolation structure 200 may include an upper portion 192 extending into or through the first isolation pattern 130, and a lower portion 194 extending into or through the upper portion of the substrate 100 and contacting the upper portion 192.

In example embodiments, a lower portion 194 of the third isolation pattern 190 may include a lower surface having a width greater than that of an upper surface thereof. In example embodiments, a sidewall of the upper portion 192 of the third isolation pattern 190 may have a constant slope with respect to the upper surface of the substrate 100, however, a sidewall of the lower portion 194 of the third isolation pattern 190 may have an increasing slope with respect to the upper surface of the substrate 100 from an upper portion toward a lower portion thereof, that is, as approaching a center of the substrate 100.

The second isolation pattern 180 at a lower portion of the isolation structure 200 may have a substantially flat or planar upper surface.

In example embodiments, the second isolation pattern 180 and the lower portion 194 of the third isolation pattern 190 contacting each other may have a cross-section taken along the second direction, which may have a circular shape or an elliptical shape.

Figure 14:
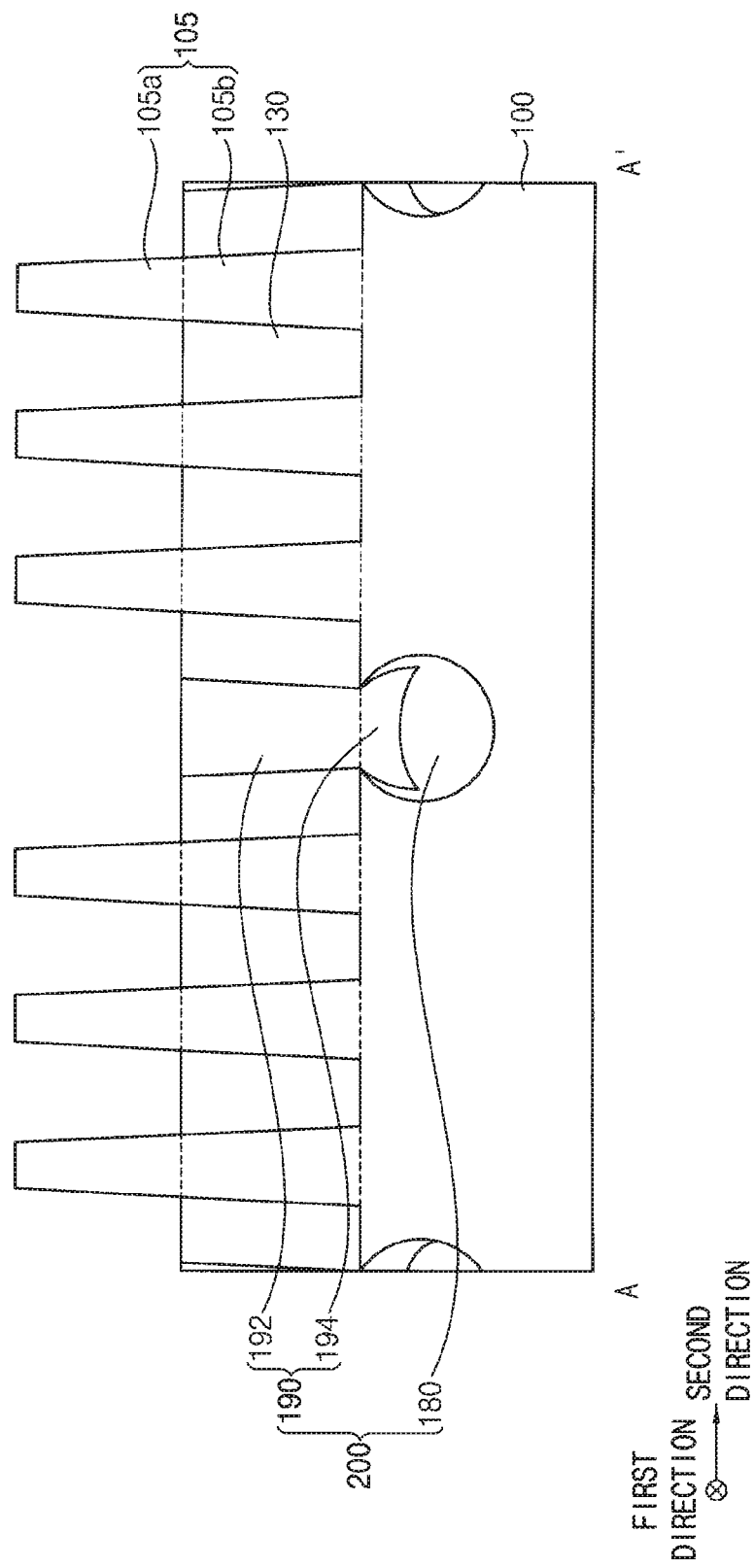
FIGS. 14 to 16 are cross-sectional views illustrating isolation structures in accordance with example embodiments.
Figure 15:
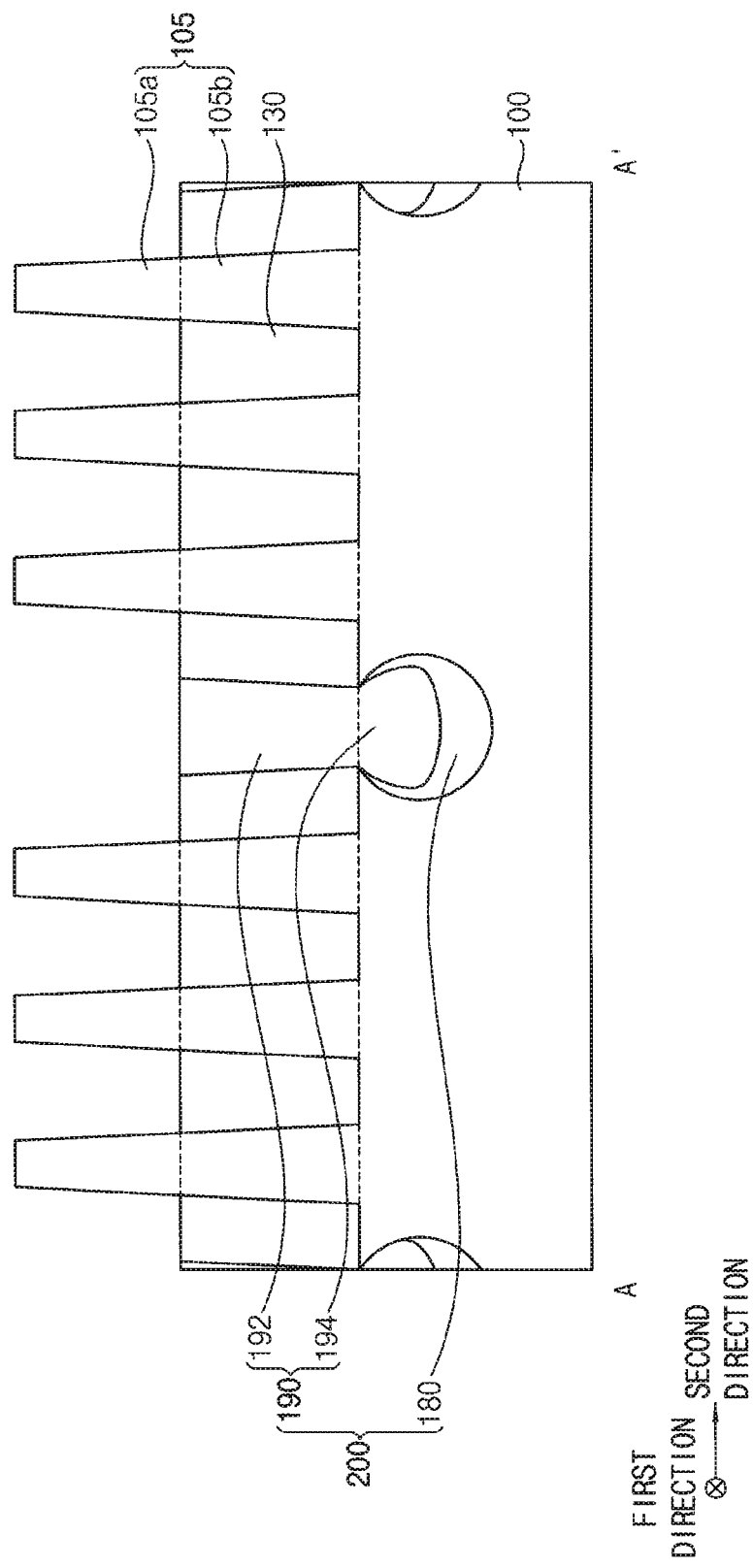
Figure 16:
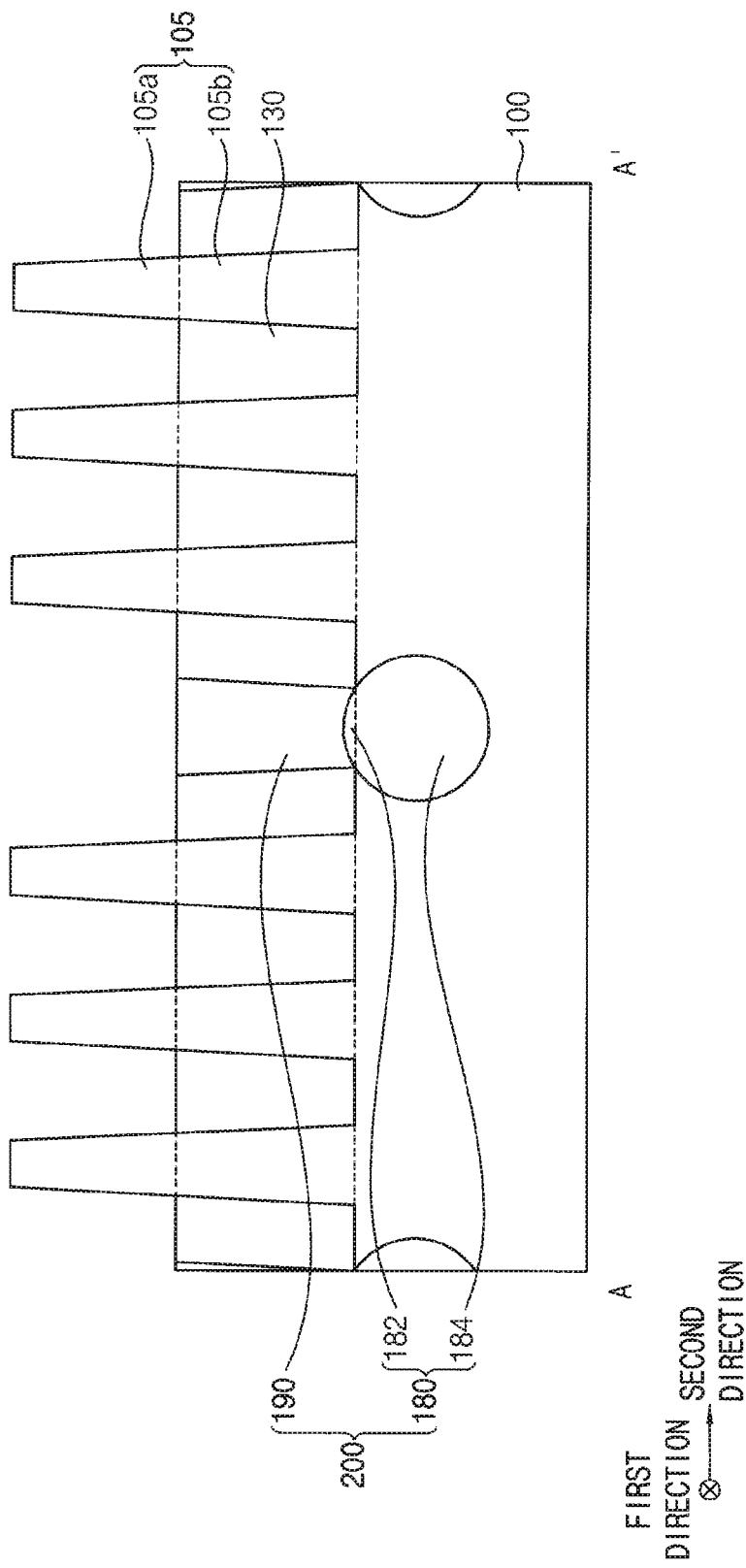

FIGS. 14 to 16 are cross-sectional views illustrating isolation structures in accordance with example embodiments.

This isolation structures may be substantially the same as or similar to the isolation structure described in FIG. 13, except for the shape thereof. Accordingly, like reference numerals refer to like elements, and detailed descriptions thereon are omitted herein for brevity.

Referring to FIG. 14, the second isolation pattern 180 may fill the central portion and the lower portion of the trench 160, and may have an upper surface not flat but curved along the second direction, that is, an upwardly convex upper surface.

In example embodiments, the cross-section of the second isolation pattern 180 in the second direction may have a circular shape or an elliptical shape. Accordingly, a central portion of the second isolation pattern 180 in the second direction may have an upper surface higher than that of an edge portion of the second isolation pattern 180 relative to the substrate 100, that is, an upper surface that protrudes away from the substrate 100.

Correspondingly, a lower surface of the third isolation pattern 190 contacting the upper surface of the second isolation pattern 180 may not be flat but curved along the second direction, more specifically, upwardly convex. In some embodiments, the lower surface of the third isolation pattern 190 may have a concave shape corresponding to the upwardly convex upper surface of the second isolation pattern 180. A central portion of the third isolation pattern 190 in the second direction may also have a lower surface higher than that of an edge portion of the third isolation pattern 190.

Referring to FIG. 15, the second isolation pattern 180 may fill the central portion and the lower portion of the trench 160, and may have an upper surface not flat but curved along the second direction, that is, a downwardly convex upper surface. In some embodiments, the upper surface of the second isolation pattern 180 may have a concave shape corresponding to a downwardly convex lower surface of the third isolation pattern 190.

In example embodiments, a central portion of the second isolation pattern 180 in the second direction may have an upper surface lower than that of an edge portion of the second isolation pattern 180 relative to the substrate 100, that is, an upper surface that is recessed towards the substrate 100.

Correspondingly, a lower surface of the third isolation pattern 190 contacting the upper surface of the second isolation pattern 180 may not be flat but curved along the second direction, more specifically, downwardly convex. A central portion of the third isolation pattern 190 in the second direction may also have a lower surface lower than that of an edge portion of the third isolation pattern 190.

Referring to FIG. 16, the second isolation pattern 180 may fill the trench 160 and a lower portion of the first opening 150, and may have an upper surface not flat but curved along the second direction, that is, an upwardly convex upper surface.

Accordingly, the second isolation pattern 180 may include an upper portion 182 extending into or through a lower portion of the third isolation pattern 190, and a lower portion extending into or through the upper portion of the substrate 100 and contacting e upper portion 182.

In example embodiments, the second isolation pattern 180 including the lower portion 184 and the upper portion 182 sequentially stacked may have a cross-section taken along the second direction, which may have a circular shape or an elliptical shape. Accordingly, a central portion of the second isolation pattern 180 in the second direction may have an upper surface higher than that of an edge portion of the second isolation pattern 180, and the maximum height of the upper portion 182 of the second isolation pattern 180 may be higher than a height of the upper surface of the substrate 100. That is, the upper portion 182 of the second isolation pattern 180 may protrude away from the upper surface of the substrate 100.

Correspondingly, a lower surface of the third isolation pattern 190 contacting the upper surface of the second isolation pattern 180 may not be flat but curved along the second direction, more specifically, upwardly convex. In some embodiments, the lower surface of the third isolation pattern 190 may have a concave shape corresponding to the upwardly convex upper surface of the second isolation pattern 180. A central portion of the third isolation pattern 190 in the second direction may also have a lower surface higher than that of an edge portion of the third isolation pattern 190 relative to the substrate 100.

Figure 17:
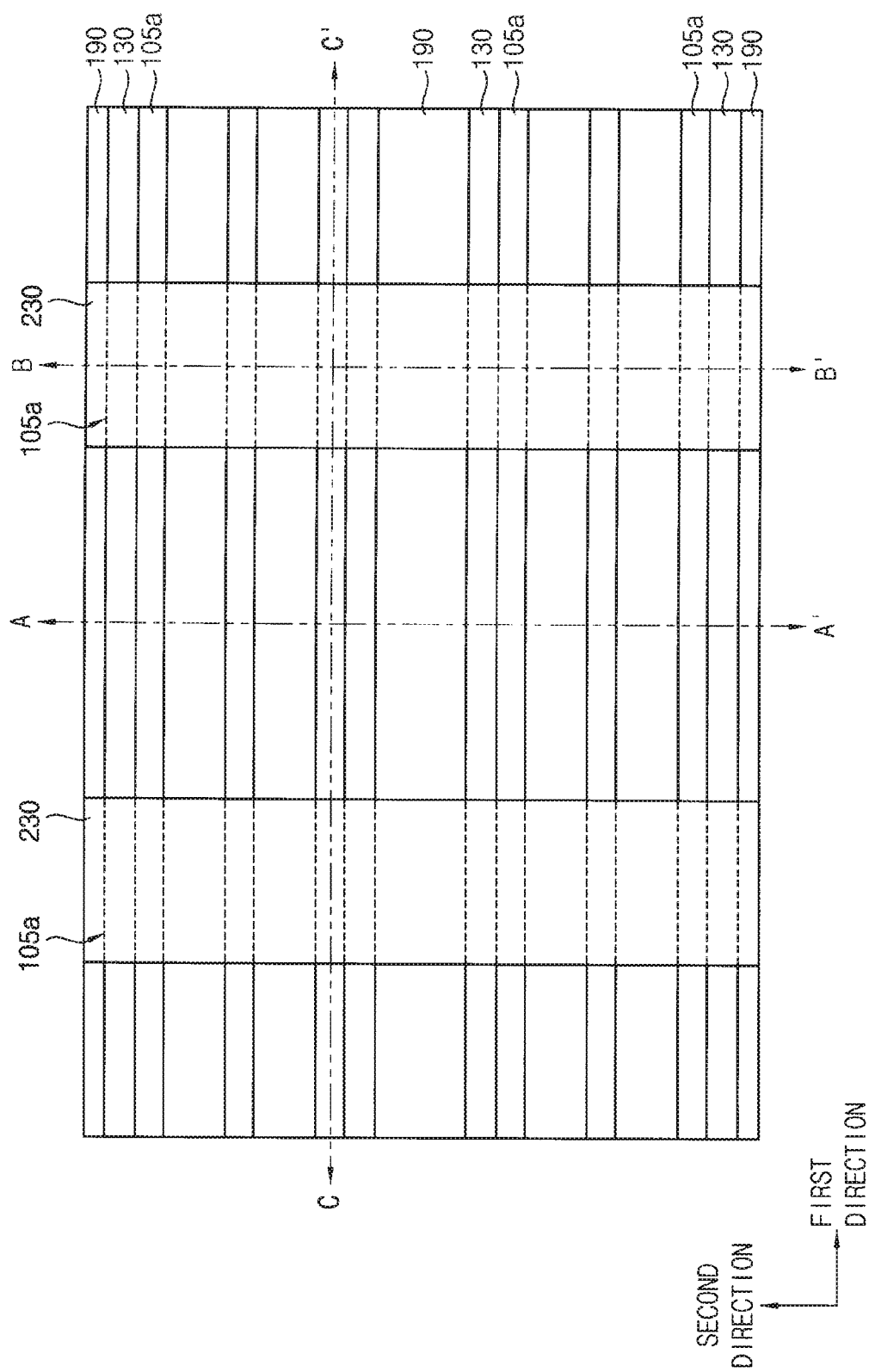
FIGS. 17 to 26 are cross-sectional views illustrating methods of manufacturing a semiconductor device in accordance with example embodiments.
Figure 18:
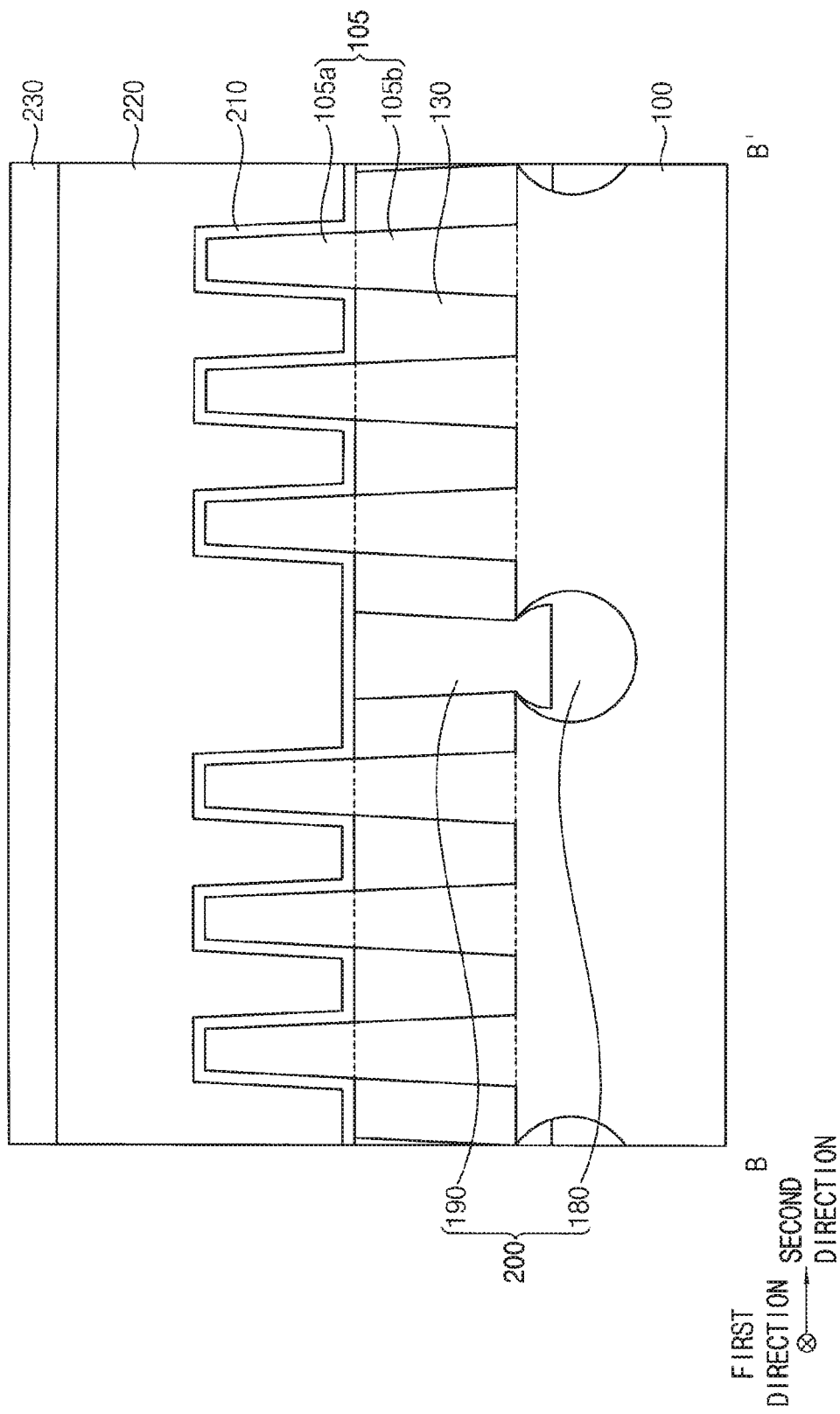
Figure 19:
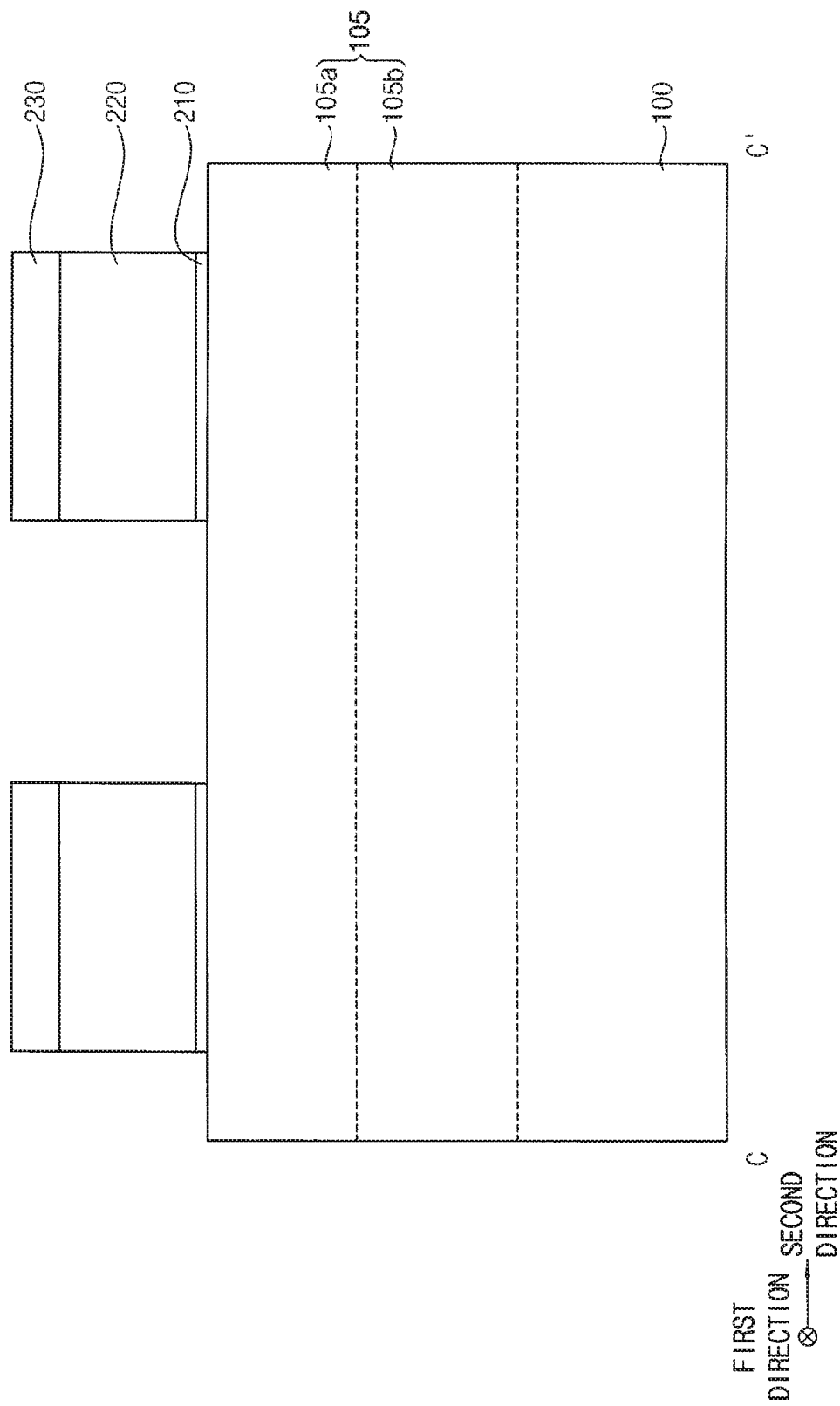
Figure 20:
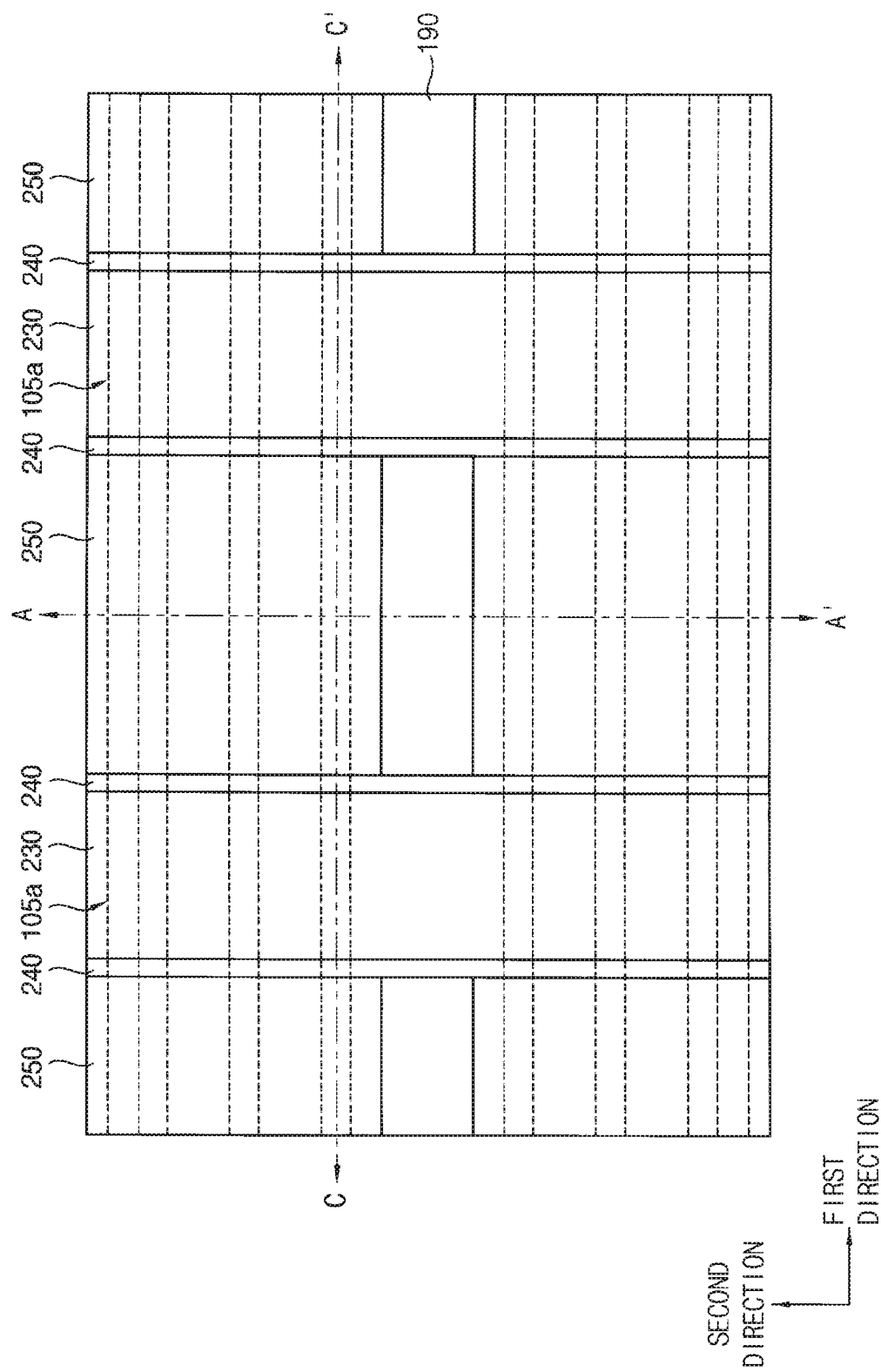
Figure 21:
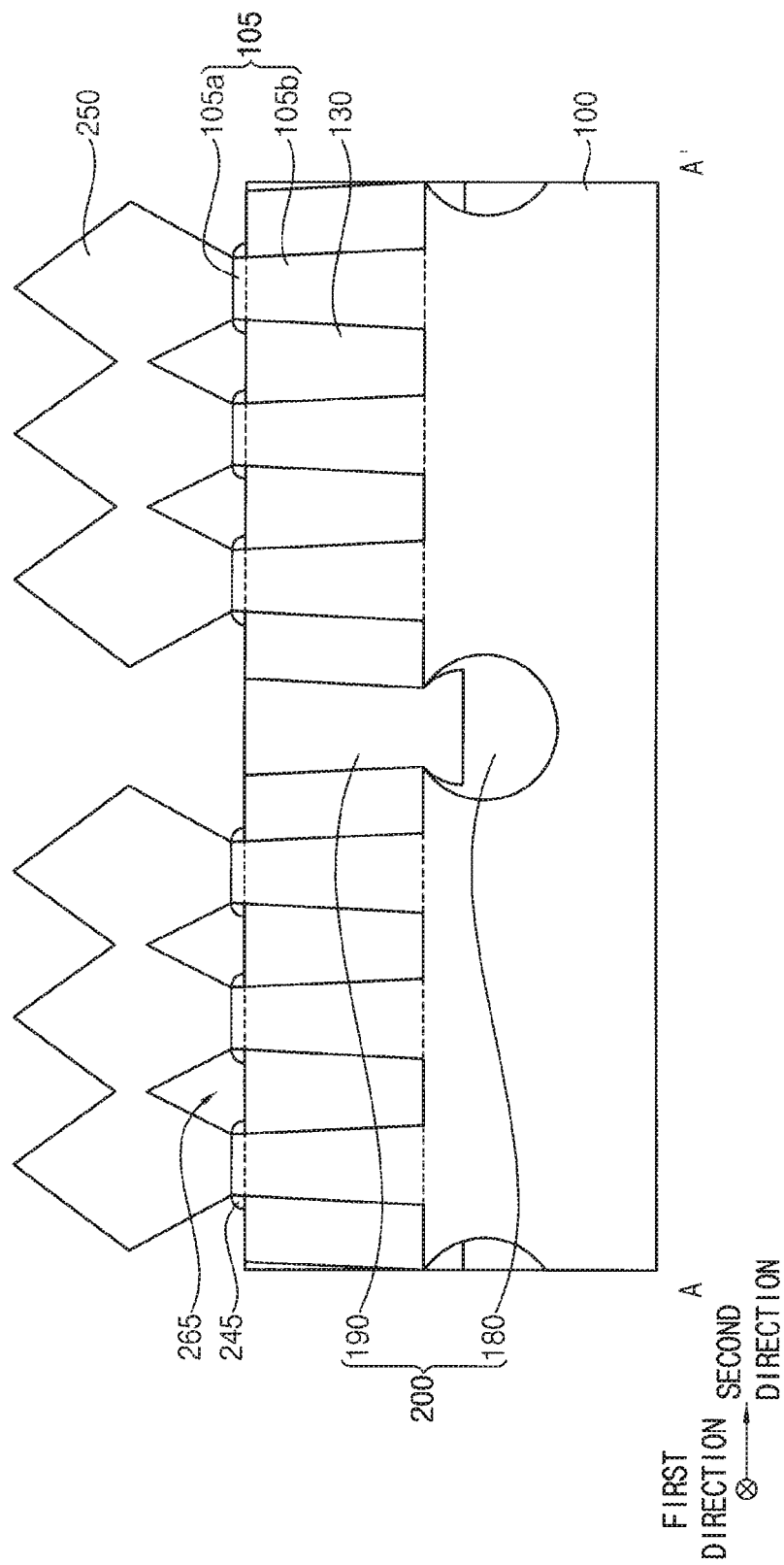
Figure 22:
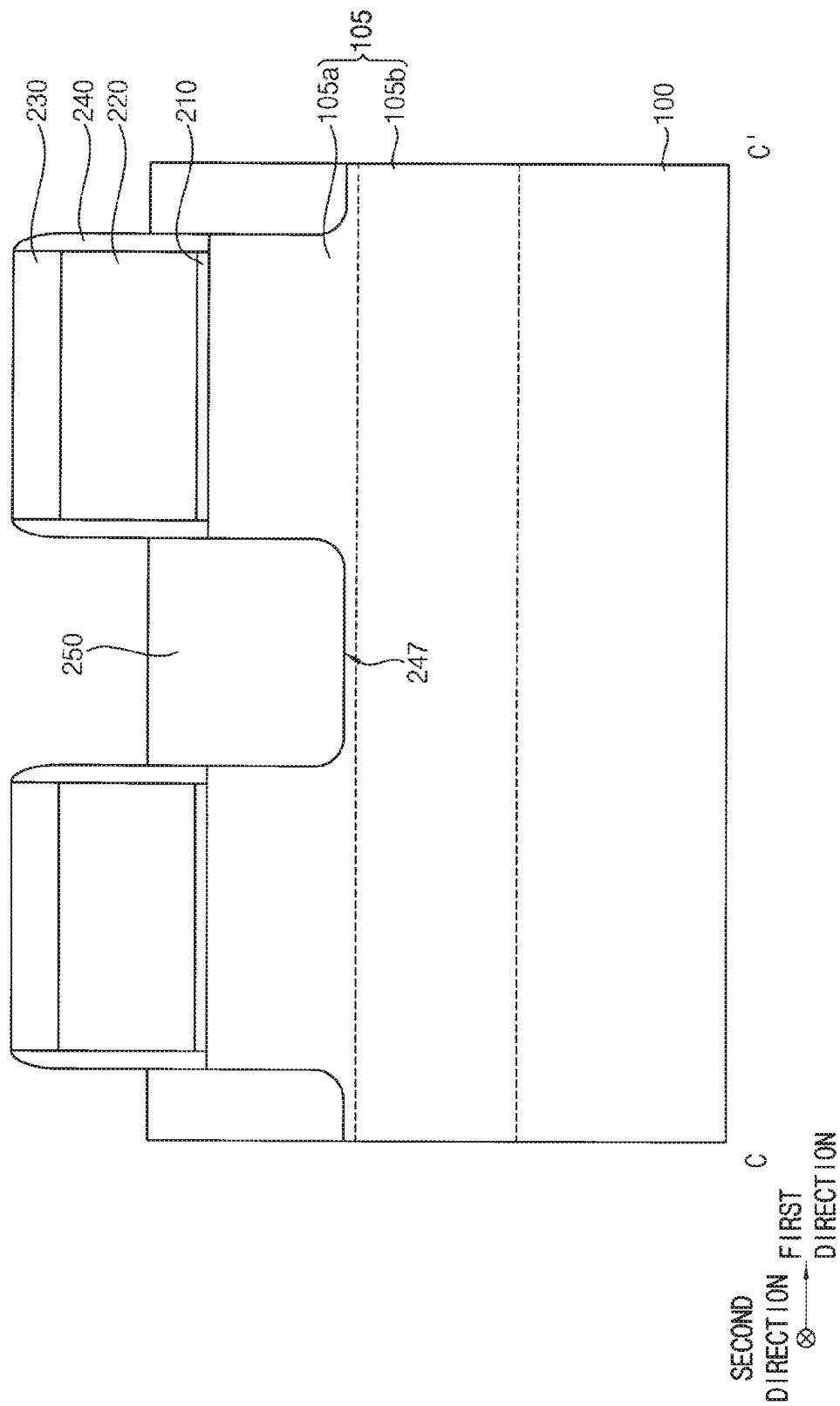
Figure 23:
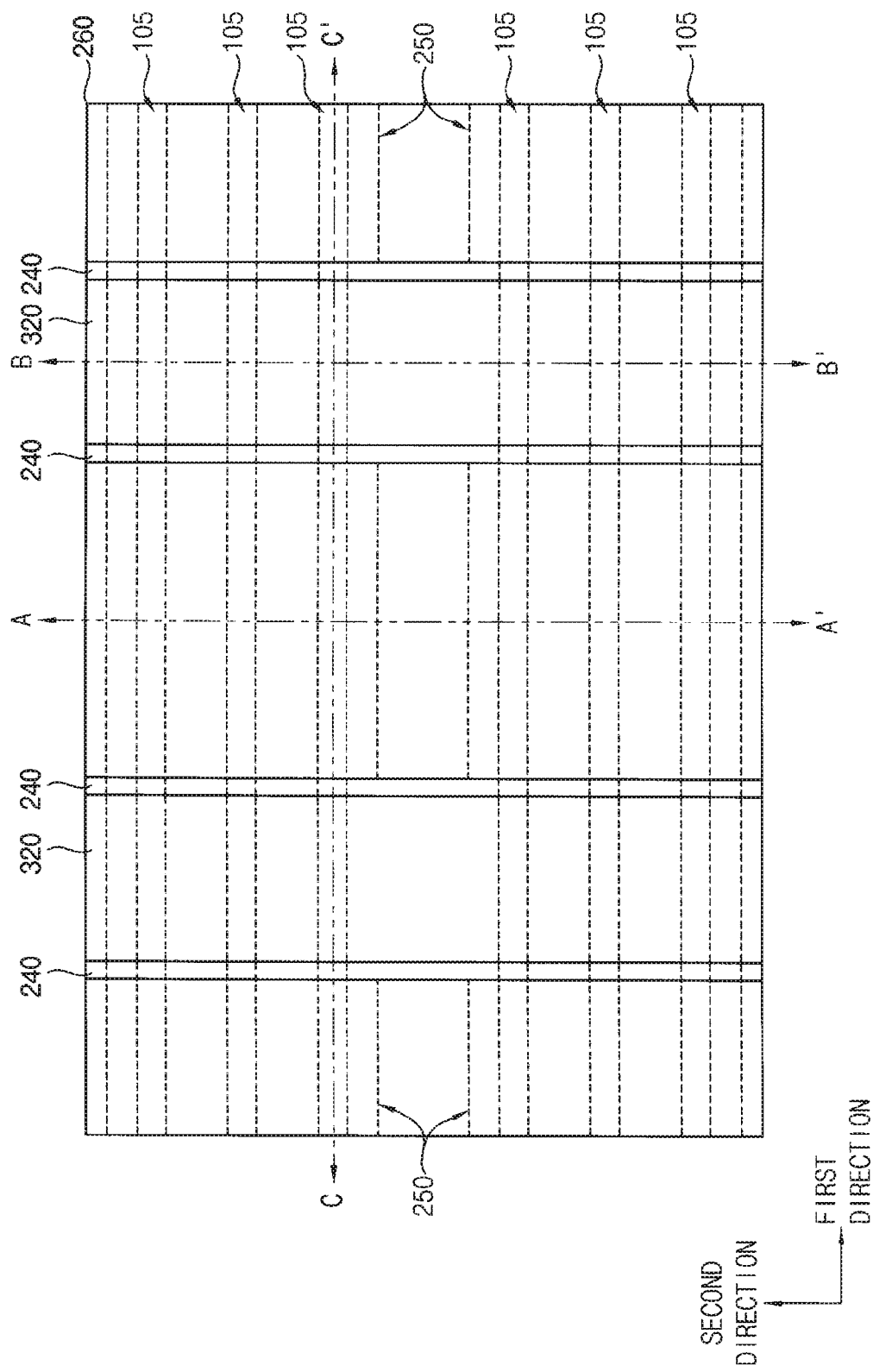
Figure 24:
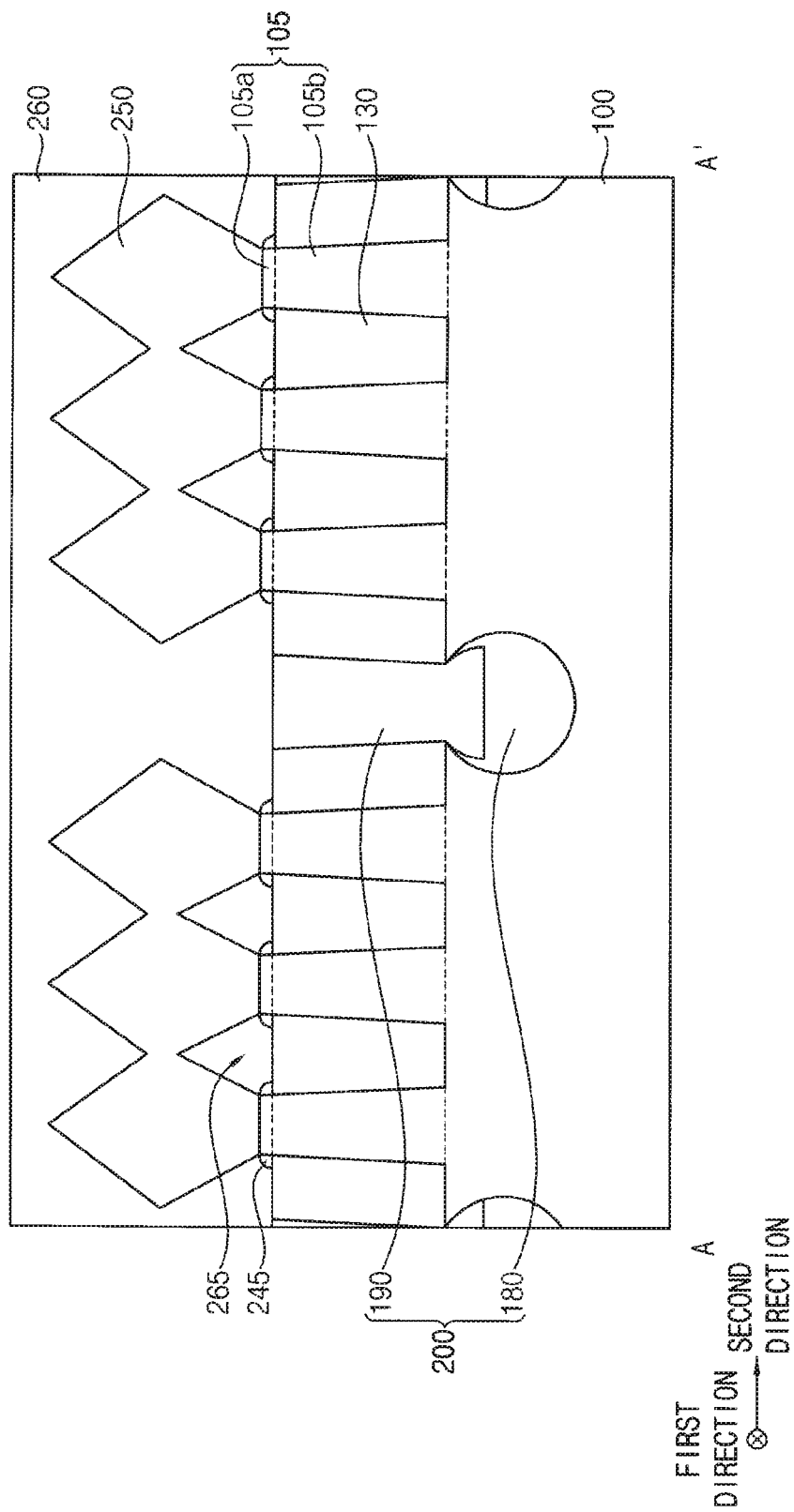
Figure 25:
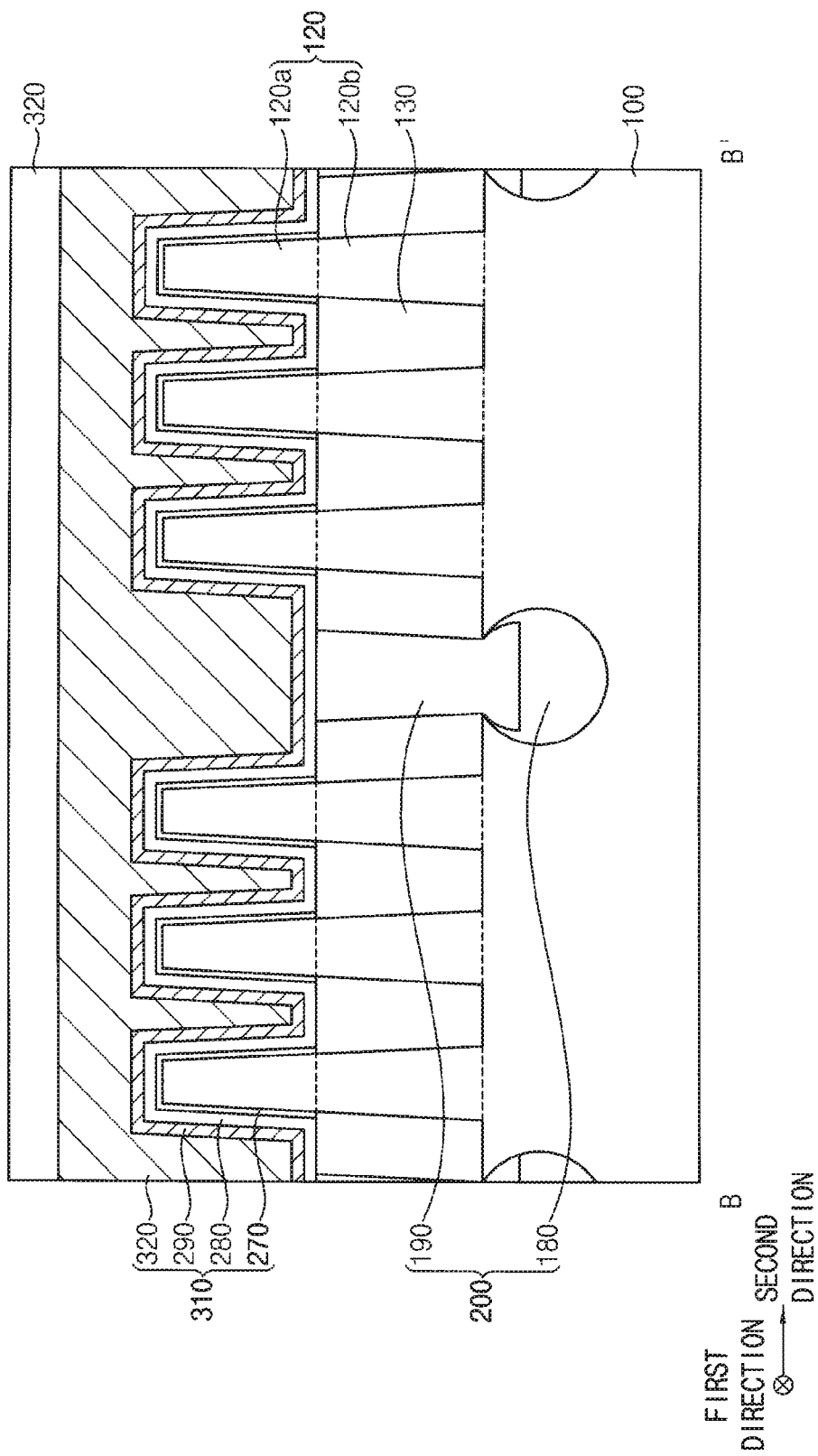
Figure 26:
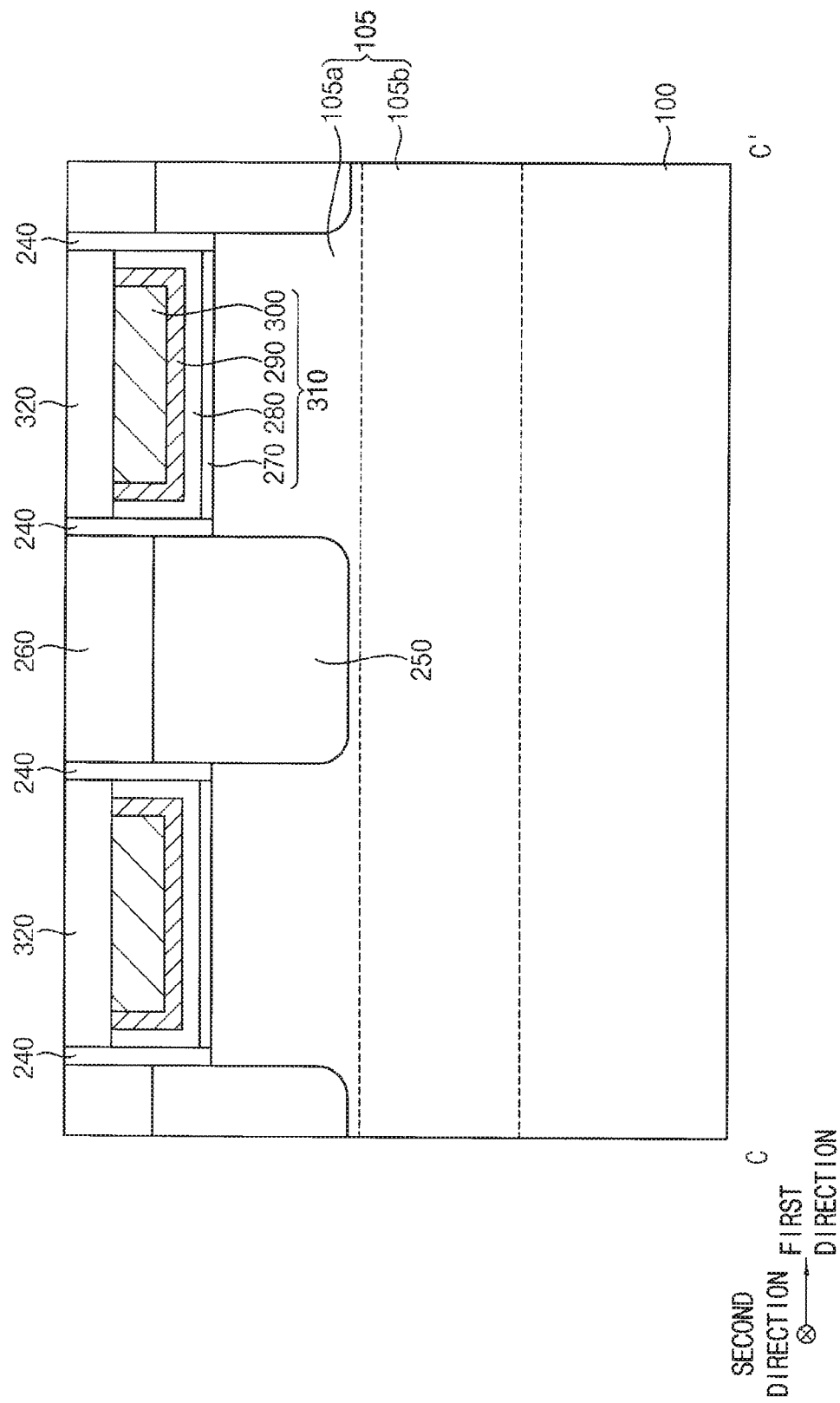

FIGS. 17 to 26 are cross-sectional views illustrating a method of manufacturing semiconductor devices in accordance with example embodiments. Specifically, FIGS. 17, 20 and 23 are plan views, and FIGS. 21 and 24 are cross-sectional views taken along lines A-A' of corresponding plan views, respectively, FIGS. 18 and 25 are cross-sectional views taken along lines B-B' of corresponding plan views, and FIGS. 19, 22 and 26 are cross-sectional views taken along lines C-C' of corresponding plan views.

This method of manufacturing the semiconductor device may be an application of the method of forming the isolation structure described in FIGS. 1 to 8 and 13 to a method of manufacturing a logic device.

Referring to FIGS. 17 to 19, processes substantially the same as or similar to the processes described in FIGS. 1 to 8 and 13 may be performed to form a dummy gate structure on a substrate 100.

Specifically, a dummy gate insulation layer, a dummy gate electrode layer and a dummy gate mask layer may be sequentially formed on active fins 105, a first isolation pattern 130 and an isolation structure 200, the dummy gate mask layer may be patterned to form a dummy gate mask 230, and the dummy gate electrode layer and the dummy gate insulation layer may be sequentially etched using the dummy gate mask 230 as an etching mask to form the dummy gate structure.

Accordingly, the dummy gate structure including a dummy gate insulation pattern 210, a dummy gate electrode 220 and the dummy gate mask 230 sequentially stacked may be formed on the substrate 100.

The dummy gate insulation layer, the dummy gate electrode layer and the dummy gate mask layer may be formed by, e.g., a CVD process, an ALD process, etc. Alternatively, the dummy gate insulation layer may be formed by performing a thermal oxidation process on the substrate 100, and in this case, the dummy gate insulation layer may be formed only on upper surfaces of the active fins 105.

In example embodiments, the dummy gate structure may extend in the second direction, and a plurality of dummy gate structures may be formed along the first direction.

Referring to FIGS. 20 to 22, a gate spacer 240 may be formed on a sidewall of the dummy gate structure, and a fin spacer 245 may be formed on a sidewall of each of the active fins 105.

The gate spacer 240 and the fin spacer 245 may be formed by forming a spacer layer on the active fins 105, the first isolation pattern 130 and the isolation structure 200 to extend on or cover the dummy gate structure, and anisotropically etching the spacer layer.

Upper portions of the active fins 105 adjacent to the dummy gate structure may be etched to form a second recess 247, and a source/drain layer 250 may be formed to fill the second recess 247.

The second recess 247 may be formed by performing a dry etching process using the gate spacer 240 on the dummy gate structures and sidewalls of the dummy gate structures as an etching mask to remove the upper portions of the active fins 105. When the second recess 247 is formed, some or most of the fin spacer 245 adjacent to the active fins 105 may be also removed, however, a lower portion of the fin spacer 245 may partially remain.

In example embodiments, the source/drain layer 250 may be formed by performing a selective epitaxial growth (SEG) process using the upper surfaces of the active fins 105 exposed by the second recess 247 as a seed.

In example embodiments, as the SEG process is performed, a single crystalline silicon-germanium layer may be formed to serve as the source/drain layer 250. Additionally, the SEG process may be performed using a p-type impurity source gas, and thus a single crystalline silicon-germanium layer doped with p-type impurities may be formed to serve as the source/drain layer 250. Accordingly, the source/drain layer 250 may serve as a source/drain region of a PMOS transistor.

The source/drain layer 250 may grow not only in a vertical direction but also in a horizontal direction to fill the second recess 247, and may contact a sidewall of the gate spacer 240.

In example embodiments, a plurality of source/drain layers 250 may be formed along the second direction, and the source/drain layers 250 growing on the neighboring ones of the active fins 105 in the second direction, respectively, may be connected and merged with each other.

Although the source/drain layer 250 serving as the source/drain of the PMOS transistor has been described above, the inventive concepts may not be limited thereto, and the source/drain layer 250 may be also formed to serve as a source/drain region of an NMOS transistor.

Accordingly, a single crystalline silicon-carbide layer or a single crystalline silicon layer may be formed to serve as the source/drain layer 250. Additionally, the SEG process may be performed using an n-type impurity source gas, and thus a single crystalline silicon-carbide layer or a single crystalline silicon layer doped with n-type impurities may be formed to serve as the source/drain layer 250.

Referring to FIGS. 23 to 26, after forming an insulation layer 260 on the substrate 100 to a sufficient height to extend on or cover the dummy gate structure, the gate spacer 240, the source/drain layer 250 and the fin spacer 245, the insulation layer 260 may be planarized until an upper surface of the dummy gate electrode 220 of the dummy gate structure may be exposed.

The dummy gate mask 230 may be also removed together with the insulation layer 260, and an upper portion of the gate spacer 240 may be also removed. A space between the source/drain layer 250 and the first isolation pattern 130 may not be completely filled with the insulation layer 260, and thus an air gap 265 may be formed.

The exposed dummy gate electrode 220 and the dummy gate insulation pattern 210 thereunder may be removed to form a second opening exposing an inner sidewall of the gate spacer 240 and the upper surfaces of the active fins 105, and a gate structure 310 may be formed to fill the second opening.

The gate structure 310 may be formed, e.g, by performing following processes.

A thermal oxidation process may be performed on the upper surfaces of the active fins 105 exposed by the second opening to form an interface pattern 270, and a gate insulation layer and a work function control layer may be sequentially formed on the interface pattern 270. The first isolation pattern 130, the isolation structure 200, the gate spacer 240 and the insulation layer 260, and a gate electrode layer may be formed on the work function control layer to sufficiently fill a remaining portion of the second opening.

The interface pattern 270 may be formed by, e.g., a CVD process, an ALD process, etc., instead of the thermal oxidation process, and may be formed not only on the upper surfaces of the active fins 105, but also on the upper surface of the first isolation pattern 130, an upper surface of the isolation structure 200 and the inner sidewall of the gate spacer 240.

The gate electrode layer, the work function control layer and the gate insulation layer may be planarized until an upper surface of the insulation layer 260 may be exposed, so that a gate insulation pattern 280 and a work function control pattern 290 sequentially stacked on an upper surface of the interface pattern 270, the upper surface of the isolation structure 200 and the inner sidewall of the gate spacer 240 may be formed, and a gate electrode 300 may be formed on the work function control pattern 290 to fill the remaining portion of the second opening. Accordingly, a lower surface and a sidewall of the gate electrode 300 may be covered by the work function control pattern 290.

The interface pattern 270, the gate insulation pattern 280, the work function control pattern 290 and the gate electrode 300 sequentially stacked may form the gate structure 310, which may form or define a transistor together with the source/drain layer 250. The transistor may form or define a PHOS transistor or an NMOS transistor according to the conductivity type of the source/drain layer 250.

After removing an upper portion of the gate structure 310 to form a third recess, a capping layer 320 may be formed to fill the third recess.

Although not shown, contact plugs and upper wirings electrically connected with the source/drain layer 250 and/or the gate structure 310 may be further formed to complete the fabrication of the semiconductor device.

As described above, the semiconductor device may include the isolation structure 200, and the isolation structure 200 may have good insulation characteristics, so that the semiconductor device may have improved electrical characteristics.

What is claimed is:

1. A semiconductor device, comprising:
   active fins protruding on an upper surface of a substrate;
   a first isolation pattern on the upper surface of the substrate, the first isolation pattern extending on respective lower sidewalls of the active fins;
   a third isolation pattern comprising:
      an upper portion extending into the first isolation pattern; and
      a lower portion extending into the upper surface of the substrate, contacting the upper portion of the third isolation pattern, and having a lower surface comprising a width that is greater than that of an upper surface thereof; and
   a second isolation pattern extending in the substrate under the third isolation pattern, contacting the third isolation pattern, and having a rounded lower surface,
   wherein sidewalls of the first isolation pattern are free of the second isolation pattern.

2. The semiconductor device of claim 1, wherein the second isolation pattern has a substantially flat upper surface contacting the third isolation pattern.

3. The semiconductor device of claim 1, wherein the second isolation pattern has a convex upper surface contacting the third isolation pattern.

4. The semiconductor device of claim 1, wherein the second isolation pattern has a concave upper surface contacting the third isolation pattern.

5. The semiconductor device of claim 1, wherein the second isolation pattern and the lower portion of the third isolation pattern contacting the second isolation pattern collectively define a cross-section of a circular shape or an elliptical shape.

6. The semiconductor device of claim 1, wherein a portion of the second isolation pattern contacting the lower portion of the third isolation pattern has a thickness increasing from a top to a bottom.

7. The semiconductor device of claim 6, wherein a portion of the second isolation pattern contacting the upper portion of the third isolation pattern has a thin film shape having a constant thickness from a top to a bottom.

8. The semiconductor device of claim 6, wherein a sidewall of the portion of the second isolation pattern contacting the lower portion of the third isolation pattern has a fluctuating slope not vertical to the upper surface of the substrate.

9. The semiconductor device of claim 1, wherein the second isolation pattern comprises a nitride, and the third isolation pattern comprises an oxide.

10. The semiconductor device of claim 1, wherein the upper portion of the third isolation pattern is directly contacting the sidewalls of the first isolation pattern.

11. The semiconductor device of claim 10, wherein an interface between the second isolation pattern and the third isolation pattern is confined below the upper surface of the substrate.

12. The semiconductor device of claim 11, wherein a thickness of the second isolation pattern varies along the interface with the third isolation pattern.

13. A semiconductor device, comprising:
active fins protruding on an upper surface of a substrate;
a first isolation pattern on the upper surface of the substrate, the first isolation pattern extending on respective lower sidewalls of the active fins;
a third isolation pattern comprising:
an upper portion extending into the first isolation pattern; and
a lower portion extending into the upper surface of the substrate, the lower portion having a lower surface comprising a width that is greater than that of an upper surface thereof;
a second isolation pattern extending in the substrate under the third isolation pattern, contacting the third isolation pattern, and having a rounded lower surface;
a gate structure on the active fins; and
a source/drain layer on the substrate adjacent to the gate structure,
wherein the upper portion of the third isolation pattern is directly contacting sidewalls of the first isolation pattern.

14. The semiconductor device of claim 13, wherein a portion of the second isolation pattern contacting the lower portion of the third isolation pattern has a thickness increasing from a top to a bottom.

15. The semiconductor device of claim 14, wherein a portion of the second isolation pattern contacting the upper portion of the third isolation pattern has a thin film shape having a constant thickness from a top to a bottom.

16. The semiconductor device of claim 14, wherein the second isolation pattern and the lower portion of the third isolation pattern contacting the second isolation pattern collectively define a cross-section taken along a direction substantially parallel to the upper surface of the substrate, the cross-section having a circular shape or an elliptical shape.

17. The semiconductor device of claim 13, wherein the first and third isolation patterns comprise an oxide, and the second isolation pattern comprises a nitride.

18. The semiconductor device of claim 13, wherein the sidewalls of the first isolation pattern are free of the second isolation pattern.

19. The semiconductor device of claim 18, wherein an interface between the second isolation pattern and the third isolation pattern is confined below the upper surface of the substrate.

20. The semiconductor device of claim 19, wherein a thickness of the second isolation pattern varies along the interface with the third isolation pattern.

* * * * *